(12) United States Patent
Khoshkava et al.

(10) Patent No.: US 10,345,910 B1
(45) Date of Patent: Jul. 9, 2019

(54) HAPTIC ACTUATOR ASSEMBLY WITH A SPRING PRE-LOAD DEVICE

(71) Applicant: IMMERSION CORPORATION, San Jose, CA (US)

(72) Inventors: Vahid Khoshkava, Montreal (CA); Juan Manuel Cruz Hernandez, Montreal (CA); Kaniyalal Shah, Fremont, CA (US)

(73) Assignee: IMMERSION CORPORATION, San Jose, CA (US)

( * ) Notice: Subject to any disclaimer, the term of this patent is extended or adjusted under 35 U.S.C. 154(b) by 0 days.

(21) Appl. No.: 16/010,180

(22) Filed: Jun. 15, 2018

(51) Int. Cl.
 *B60B 1/02* (2006.01)
 *G06F 3/01* (2006.01)
 *B06B 1/06* (2006.01)
 *B06B 1/02* (2006.01)

(52) U.S. Cl.
 CPC ............ *G06F 3/016* (2013.01); *B06B 1/0238* (2013.01); *B06B 1/0688* (2013.01); *B06B 2201/56* (2013.01)

(58) Field of Classification Search
 CPC ...... G06F 3/016; B06B 1/0238; B06B 1/0688
 USPC ....................................................... 340/407.1
 See application file for complete search history.

(56) References Cited

U.S. PATENT DOCUMENTS

| 2011/0210834 | A1* | 9/2011 | Pasquero | ................ G06F 3/016 |
| | | | | 340/407.1 |
| 2012/0126959 | A1* | 5/2012 | Zarrabi | ................ B06B 1/0688 |
| | | | | 340/407.1 |
| 2019/0025954 | A1* | 1/2019 | Wang | ...................... G06F 3/041 |

OTHER PUBLICATIONS

"Piezo Haptic Actuator, PowerHap™ 2.5G Type Preliminary Data" pp. 1-9.
"PowerHap™ Piezo actuators with haptic feedback, Technologies & Products Press Conference 2016" pp. 1-16.

* cited by examiner

*Primary Examiner* — Kerri L McNally
(74) *Attorney, Agent, or Firm* — Medler Ferro Woodhouse & Mills PLLC

(57) ABSTRACT

A haptic actuator assembly includes a haptic actuator configured to output displacement along a perpendicular axis and a pre-load device. The pre-load device is disposed adjacent to the haptic actuator and configured to generate a compressive load on the haptic actuator along the perpendicular axis to oppose expansion of the haptic actuator along the perpendicular axis. The pre-load device includes a casing and at least a first spring component. The casing includes a cover and a base spaced apart from and extending parallel to the cover. The haptic actuator is disposed between the cover and the base, and the first spring component is configured to exert a force in order to create the compressive load on the haptic actuator along the perpendicular axis.

20 Claims, 18 Drawing Sheets

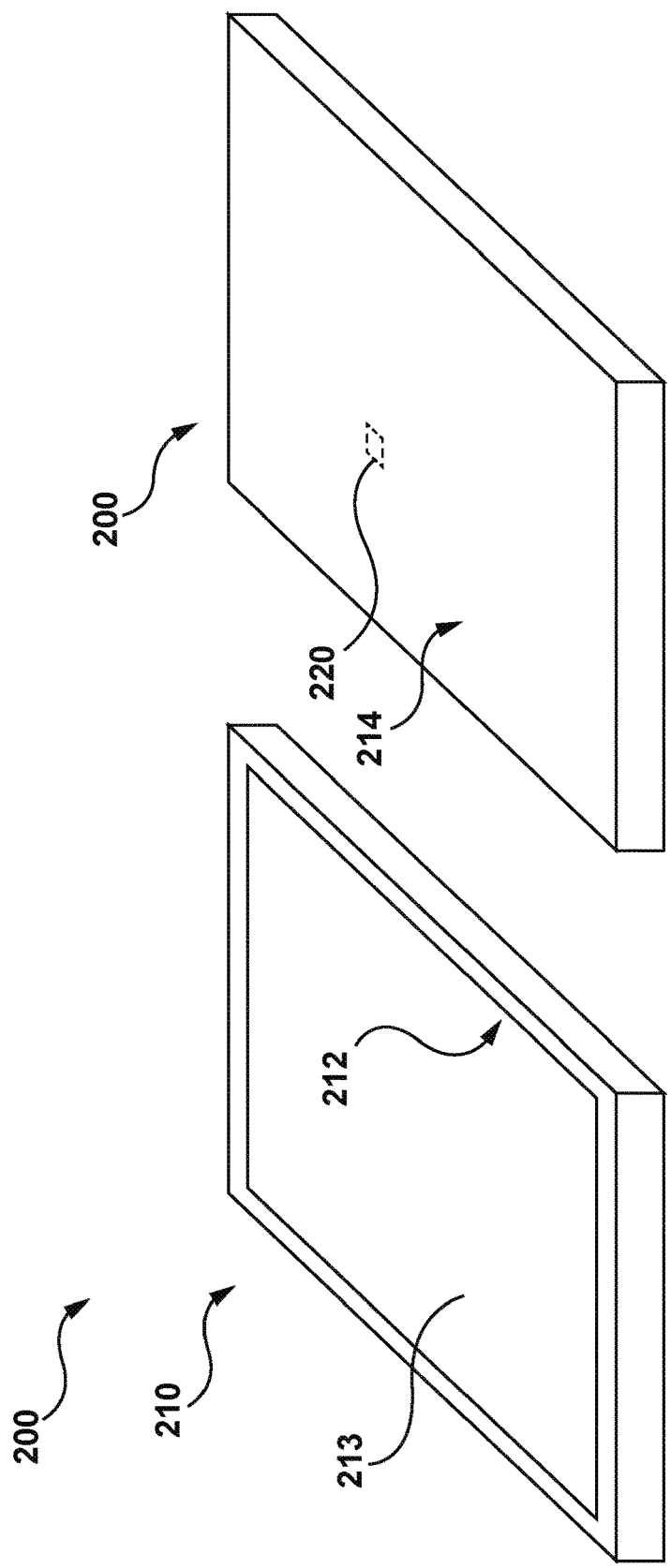

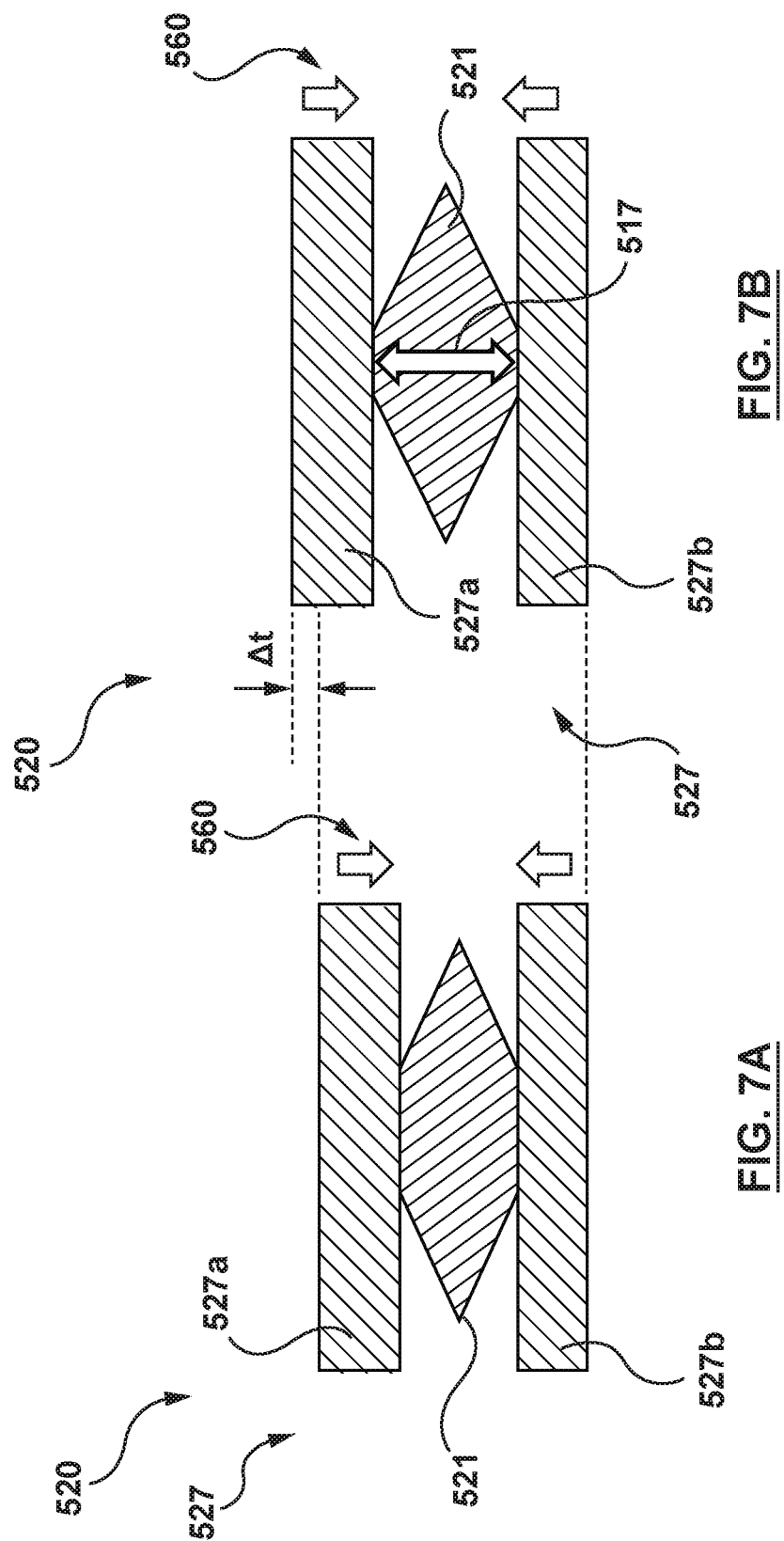

HAPTIC ACTUATOR ASSEMBLY WITH A SPRING PRE-LOAD DEVICE

FIELD OF THE INVENTION

The present invention is directed to a haptic actuator assembly with a mechanical pre-load device that has application in gaming, consumer electronics, automotive, entertainment, and other industries.

BACKGROUND

Haptics provide a tactile and force feedback technology that takes advantages of a user's sense of touch by applying haptic effects, such as forces, vibrations, and other motions to a user. Devices such as mobile devices, tablet computers, and handheld game controllers can be configured to generate haptic effects. Haptic effects can be generated with haptic actuators, such as an eccentric rotating mass (ERM) actuator or a linear resonant actuator (LRA). The haptic effects may include a vibrotactile haptic effect that provides a vibration at a surface or other portion of such devices.

SUMMARY

One aspect of embodiments described herein relates to a haptic actuator assembly including a haptic actuator and a pre-load device. The haptic actuator includes a layer of piezoelectric material configured to generate strain along a parallel axis, the parallel axis being parallel to a planar surface of the layer, and includes a displacement conversion device configured to convert the strain of the layer of piezoelectric material along the parallel axis to expansion or contraction of the haptic actuator along a perpendicular axis, the perpendicular axis being perpendicular to the planar surface of the layer. The expansion or contraction of the haptic actuator is configured to generate a displacement of the haptic actuator along the perpendicular axis. The pre-load device is adjacent to the haptic actuator and configured to generate a compressive load on the haptic actuator along the perpendicular axis. The pre-load device includes a casing having a cover and a base spaced apart from and extending parallel to the cover. The haptic actuator is disposed between the cover and the base, the cover and the base being disposed at respective opposite ends of the haptic actuator along the perpendicular axis thereof. A first spring component is disposed within the casing such that a first end of the first spring component is coupled to an interior surface of the cover and a second opposing end of the first component is coupled to an outer surface of the haptic actuator. The first spring component is configured to exert a force in order to create the compressive load on the haptic actuator along the perpendicular axis.

Another aspect of the embodiments herein relates to a haptic actuator assembly including a haptic actuator and a pre-load device. The haptic actuator includes a layer of piezoelectric material configured to generate strain along a parallel axis, the parallel axis being parallel to a planar surface of the layer, and includes a displacement conversion device configured to convert the strain of the layer of piezoelectric material along the parallel axis to expansion or contraction of the haptic actuator along a perpendicular axis, the perpendicular axis being perpendicular to the planar surface of the layer. The expansion or contraction of the haptic actuator is configured to generate a displacement of the haptic actuator along the perpendicular axis. The pre-load device is adjacent to the haptic actuator and configured to generate a compressive load on the haptic actuator along the perpendicular axis. The pre-load device includes a casing having a cover, a base spaced apart from and extending parallel to the cover, a first spring component, and a second spring component. The first spring component and the second spring component are disposed at respective opposite ends of the cover and each of the first spring component and the second spring component extends between the cover and the base. The first spring component and the second spring component are configured to collectively exert a force in order to create the compressive load on the haptic actuator along the perpendicular axis. The haptic actuator is disposed between the cover and the base, the cover and the base being disposed at respective opposite ends of the haptic actuator along the perpendicular axis thereof.

Another aspect of the embodiments herein relates to is a haptic-enabled device including a housing, a power source, a control device, and a haptic actuator assembly configured to generate a haptic effect at an outer surface of the housing. The haptic actuator includes a layer of piezoelectric material configured to generate strain along a parallel axis, the parallel axis being parallel to a planar surface of the layer, and includes at least two electrodes attached to or embedded within the layer of piezoelectric material, and includes a displacement conversion device configured to convert the strain of the layer of piezoelectric material along the parallel axis to expansion or contraction of the haptic actuator along a perpendicular axis, the perpendicular axis being perpendicular to the planar surface of the layer. The expansion or contraction of the haptic actuator is configured to generate a displacement of the haptic actuator along the perpendicular axis. The pre-load device is adjacent to the haptic actuator and configured to generate a compressive load on the haptic actuator along the perpendicular axis. The pre-load device includes a casing having a cover and a base spaced apart from and extending parallel to the cover. The haptic actuator is disposed between the cover and the base, the cover and the base being disposed at respective opposite ends of the haptic actuator along the perpendicular axis thereof. A first spring component is disposed within the casing such that a first end of the first spring component is coupled to an interior surface of the cover and a second opposing end of the first component is coupled to an outer surface of the haptic actuator. The first spring component is configured to exert a force in order to create the compressive load on the haptic actuator along the perpendicular axis. The control unit is configured to control the power source to provide power to the at least two electrodes of the haptic actuator.

BRIEF DESCRIPTION OF THE DRAWINGS

The foregoing and other features, objects and advantages of the invention will be apparent from the following detailed description of embodiments hereof as illustrated in the accompanying drawings. The accompanying drawings, which are incorporated herein and form a part of the specification, further serve to explain the principles of the invention and to enable a person skilled in the pertinent art to make and use the invention. The drawings are not to scale.

FIGS. 3A and 3B depict a haptic-enabled device and a haptic actuator assembly disposed on a back side of the haptic-enabled device, according to an embodiment hereof.

FIGS. 7A and 7B depict a haptic actuator assembly with a haptic actuator and a pre-load device, according to an embodiment hereof.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

One aspect of the embodiments herein relates to providing a pre-load device for a haptic actuator assembly. The haptic actuator assembly may include a haptic actuator, such as a piezoelectric actuator, that is configured to output displacement (e.g., strain or other deformation) and force. In one example, the displacement may be used to generate a vibrotactile haptic effect, by oscillating between a first displacement value and a second displacement value. The pre-load device may be configured to generate a pre-load on the haptic actuator that constrains the displacement provided by the haptic actuator. The constraint may still allow the haptic actuator to output displacement, but reduces an amplitude of the displacement relative to a situation in which the pre-load device is absent. In some instances, the displacement may take the form of strain that causes the haptic actuator to expand along a particular axis, and the pre-load generated by the pre-load device may be a compressive load that opposes expansion of the haptic actuator along that axis. In some instances, the pre-load may be a load that is independent of user interaction or influences that are external to the haptic actuator assembly. In other words, the pre-load may be a load that is, e.g., built into the haptic actuator assembly or internal to the haptic actuator assembly. The pre-load may constrain a displacement from the haptic actuator, an amount of change in the displacement of the haptic actuator, or a combination thereof.

Figure 18:
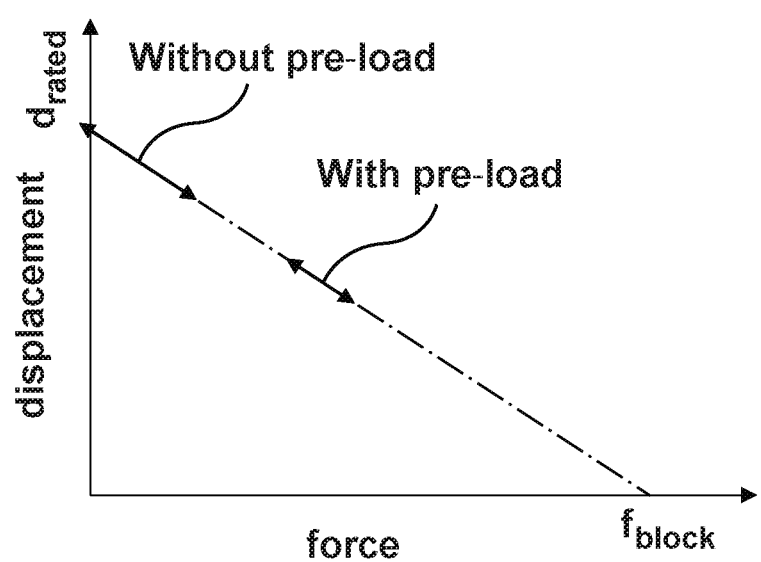
FIG. 18 provides a graph that depicts an example relationship between force that is output by a haptic actuator and displacement that is output by the haptic actuator, according to an embodiment hereof.

In an embodiment, the pre-load device may constrain or otherwise oppose displacement from the haptic actuator in order to prevent a force that is also output by the haptic actuator from becoming too weak. For instance, the haptic actuator may have a force-displacement profile like that in FIG. 18, in which the haptic actuator outputs less force as it outputs more displacement, and vice versa. If no pre-load is applied to the haptic actuator when the haptic actuator is driven with a drive signal or other stimulus, the haptic actuator may in some instances output a displacement that is equal to a rated displacement $d_{rated}$ (also referred to as nominal displacement) that is associated with the haptic actuator and with an amplitude of the drive signal. For instance, the haptic actuator may be a piezoelectric actuator. When a drive signal is applied to the piezoelectric actuator, the piezoelectric actuator may output a strain along a particular axis that is equal to a rated displacement (e.g., rated strain). When the amount of displacement provided by the haptic actuator is equal to the rated displacement, however, the displacement may be accompanied by little to no force. For example, FIG. 18 illustrates a situation in which a haptic actuator outputs a displacement that oscillates in value near a rated displacement of the haptic actuator (e.g., as a result of being driven by an oscillating drive signal). The haptic actuator may output such displacement because of an absence of a pre-load or of an external load. The oscillating displacement may translate into a vibrotactile haptic effect, but the vibrotactile haptic effect may be accompanied by only a small amount of force, as depicted in FIG. 18. As a result, the vibrotactile haptic effect may be perceived by a user as being very weak, or may not be perceived at all.

FIG. 18 further illustrates another situation in which a haptic actuator generates displacement in the presence of a pre-load. The displacement in both situations in FIG. 18 may be generated by the same signal amplitude or the same drive signal. In an embodiment, the pre-load may constrain the displacement from the haptic actuator to a value that is a fraction (e.g., ½, ¾) of its rated displacement. As an example, the pre-load may constrain displacement that is output by the haptic actuator such that the displacement is reduced from 35 μm (when the pre-load is absent) to 1 μm (when the pre-load is present). By decreasing the displacement, the pre-load can cause an increase in the force output by the haptic actuator. As a result, if a vibrotactile haptic effect is generated by a haptic actuator assembly that includes the pre-load, the force accompanying the vibrotactile haptic effect may be stronger and more perceivable relative to the situation in which the vibrotactile haptic effect is generated by a haptic actuator having no pre-load.

In an embodiment, the pre-load device may constrain or otherwise oppose displacement from the haptic actuator in order to protect the haptic actuator. For instance, a haptic actuator that includes piezo ceramic material may be brittle and thus may suffer cracking or other damage from excessive strain or other displacement. In such an instance, the pre-load device may constrain a range of motion from the haptic actuator by constraining its displacement, and thus may guard against the haptic actuator suffering damage associated with excessive strain. Stated another way, the pre-load device may protect the haptic actuator by opposing excessive displacement from the haptic actuator.

In an embodiment, the pre-load device may be a mechanical in nature and may be configured to generate a pre-load via a spring force or spring forces. Stated another way, the pre-load device may include at least one spring component that generates a spring force to provide a pre-load on the haptic actuator. The spring force or spring forces may, e.g., generate a compressive load that opposes expansion of the haptic actuator along one or more axes of motion. A spring component is utilized to compress the haptic actuator, and thereby pre-load the haptic actuator, and the total stiffness of the system is thereby changed. The displacement output by the haptic actuator is a function of the stiffness of the system, and thus the spring component constrains or reduces the displacement or strain from the haptic actuator.

In an embodiment, a haptic actuator assembly having the pre-load device may be disposed at a location at which the haptic actuator assembly will experience little to no external load. For instance, the haptic actuator assembly may be disposed at a back side of a mobile phone, such as on an inner surface of a back panel of the mobile phone. The back panel may have a low mass (e.g., less than 1 g), and may exert less than 1 N of external load on the haptic actuator assembly. In such a situation, the pre-load device may advantageously provide a pre-load to constrain displacement of a haptic actuator of the assembly.

Figure 1:
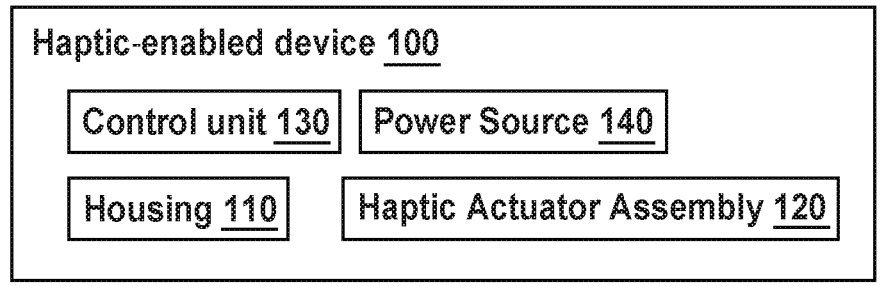
FIG. 1 depicts a block diagram of a haptic-enabled device having a haptic actuator assembly, according to an embodiment hereof.

FIG. 1 depicts a block diagram of a haptic-enabled device 100 that may include a haptic actuator assembly 120 that incorporates a pre-load device. More specifically, the haptic-enabled device 100 includes a housing 110, the haptic actuator assembly 120, a control unit 130, and a power source 140. In an embodiment, the haptic-enabled device 100 may be a user interface device such as a mobile phone, tablet computer, laptop, handheld game controller, wearable device (e.g., haptic-enabled electronic watch, glove, or head-mounted device) or any other user interface device.

In an embodiment, the power source 140 may include a battery or other energy storage device that is configured to provide power for the haptic actuator assembly 120 to generate a haptic effect (the terms power and energy are used interchangeably herein). In an embodiment, the control unit 130 may be configured to control the power source 140 to drive a haptic actuator, which is described below in more detail, of the haptic actuator assembly 120. For instance, the control unit 130 may be configured to control the power source 140 to generate a drive voltage signal or a drive current signal to be applied to the haptic actuator of the haptic actuator assembly 120. The power source 140 may be configured to generate a drive signal for the haptic actuator of the haptic actuator assembly 120 that has an amplitude in a range of 50 V to 100 V (e.g., a 60 V drive signal).

In an embodiment, the control unit 130 may be dedicated to controlling the generating of haptic effects on the haptic-enabled device 100, or may be a general purpose control unit that controls other operations on the haptic-enabled device 100. In an embodiment, the control unit 130 may include one or more microprocessors, one or more processing cores, a programmable logic array (PLA), a field programmable gate array (FPGA), an application specific integrated circuit (ASIC), or any other processing circuit.

Figure 2A:
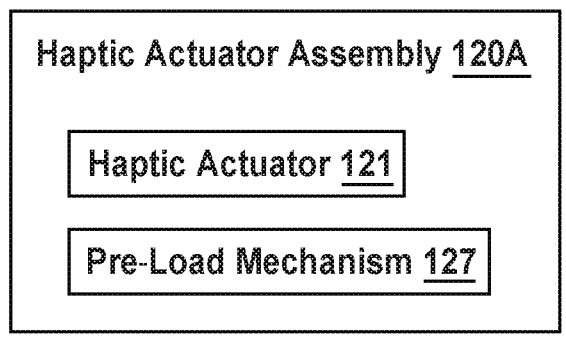
FIGS. 2A and 2B depict block diagrams of a haptic actuator assembly and a haptic actuator, according to embodiments hereof.

FIG. 2A illustrates a block diagram of a haptic actuator assembly 120A that is an embodiment of the haptic actuator assembly 120. The haptic actuator assembly 120A includes a haptic actuator 121 and a pre-load device 127. The pre-load device 127 is described below in more detail. In an embodiment, the pre-load device may be configured to generate a compressive load that is in a range of 2 N to 4 N. In an embodiment, the haptic actuator 121 is configured to output displacement and force along a particular axis. For instance, the haptic actuator 121 may be a piezoelectric actuator, or an electroactive polymer (EAP) actuator, such as an EAP actuator that includes polyvinylidene difluoride (PVDF). In an embodiment, the haptic actuator 121 may be configured to exhibit strain or other deformation that expands or shrinks the haptic actuator along one or more axes.

Figure 2B:
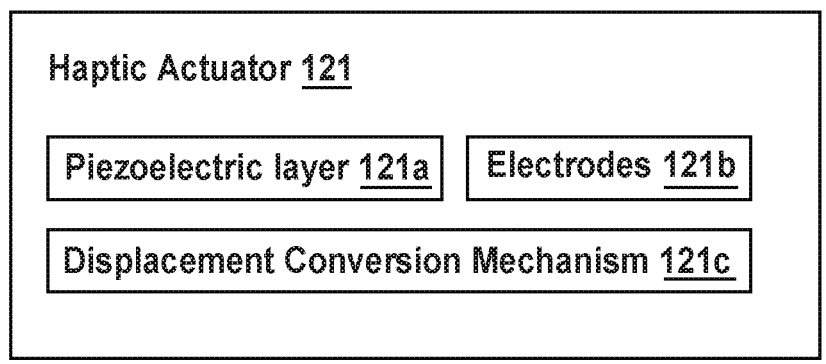

FIG. 2B depicts a block diagram of an embodiment of the haptic actuator 121. In the embodiment of FIG. 2B, the haptic actuator 121 includes a piezoelectric layer 121a (also referred to as a layer of piezoelectric material or a sheet of piezoelectric material), electrodes 121b, and a displacement conversion device 121c. The piezoelectric layer 121a may be connected to the electrodes 121b, and may be configured to output strain along one or more axes when a drive signal is applied to the electrodes 121b. In some cases, the piezoelectric layer 121 may include a stack of sub-layers of piezoelectric material, wherein each of the sub-layers is directly sandwiched between two electrodes of the electrodes 121b. In other cases, the piezoelectric layer 121a has only one such sub-layer.

In an embodiment, the displacement conversion device 121c may be configured to convert strain or other displacement that is along a first axis (e.g., an x-axis) to displacement that is along a second axis (e.g., a z-axis). In an embodiment, the first axis may be a parallel axis, wherein the parallel axis is parallel to a planar surface of the piezoelectric layer 121a. In an embodiment, the second axis may be a perpendicular axis, wherein the perpendicular axis is perpendicular to the planar surface of the piezoelectric layer 121a. In some cases, the displacement conversion device 121c may be a displacement amplification device that is configured to amplify a displacement along the first axis (e.g., $\Delta x$) to a greater displacement (e.g., $\Delta z$) along the second axis.

FIGS. 3A and 3B depict a haptic-enabled device 200 that is an embodiment of the haptic-enabled device 100. The haptic-enabled device 200 may be, e.g., a mobile phone or a tablet computer. The haptic-enabled device 200 may comprise a housing 210 that is formed by at least a front panel 212 and a back panel 214. The front panel 212 may form a front side of the housing 210, and may incorporate a touch screen device 213, such as a liquid crystal display (LCD) or light emitting display (LED) that has capacitive or resistive touch sensors. The back panel 214 may form a back side of the housing 210. The front side of the housing 210 may be a side that generally faces a user during use, while the back side is disposed opposite of, or opposing, the front side of the housing 210.

Figure 4:
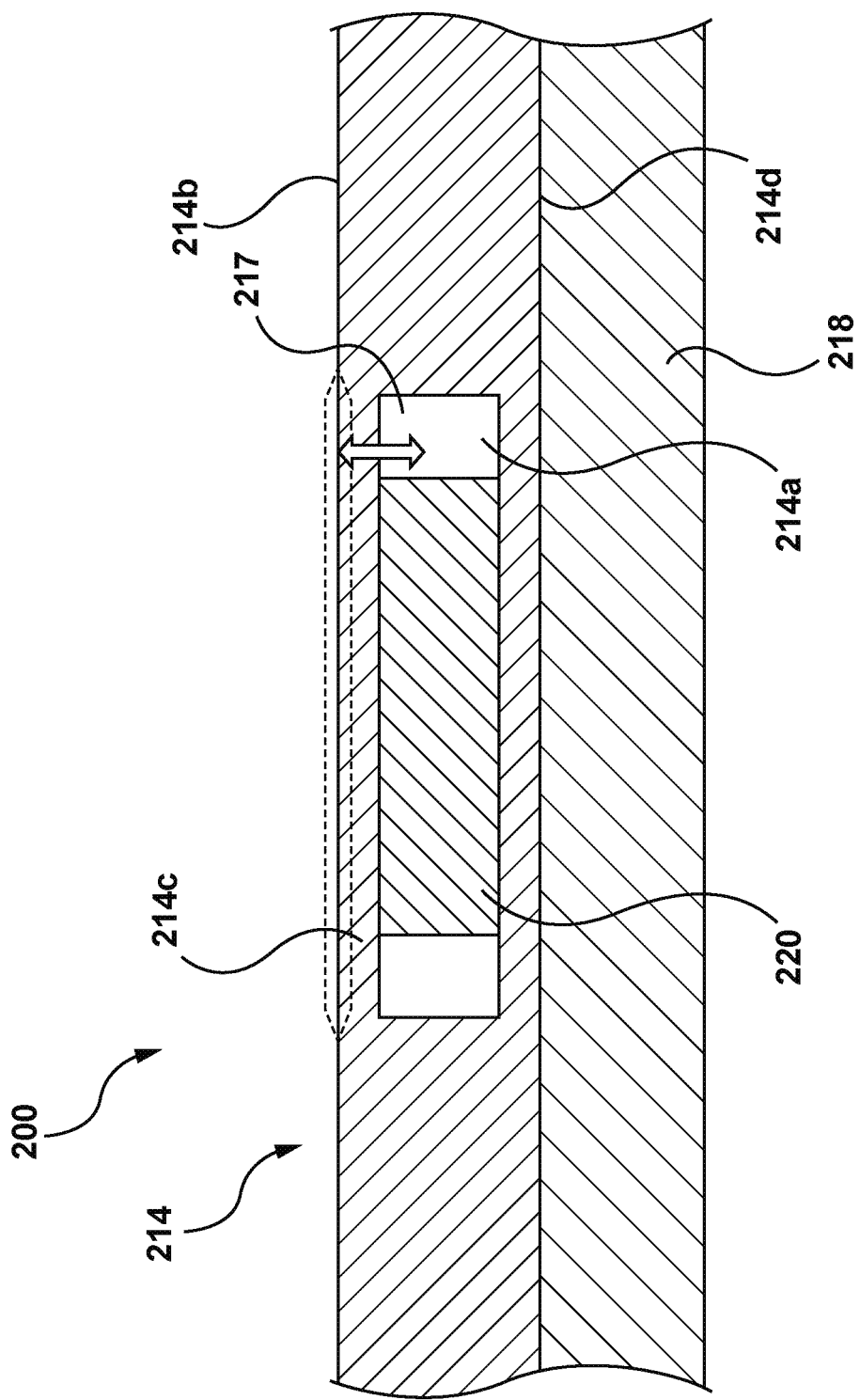
FIG. 4 depicts a haptic actuator assembly disposed within a back panel of a housing of a haptic actuator assembly, according to an embodiment hereof.

As illustrated in FIG. 3B, the haptic-enabled device 200 further includes a haptic actuator assembly 220. In some embodiments, the haptic actuator assembly 220 is disposed within the back panel 214, or on an inner surface or outer surface of the back panel 214. For instance, FIG. 4 depicts an embodiment in which the back panel 214 has a cavity 214a, and the haptic actuator assembly 220 is embedded within the back panel 214 by being disposed within the cavity 214a. The haptic actuator assembly 220 may be configured to, e.g., generate a vibrotactile haptic effect at an outer or exterior surface 214b of the back panel 214. The vibrotactile haptic effect may be generated when the haptic actuator assembly repeatedly expands and contracts along an axis 217 in FIG. 4 at a certain frequency in order to output an oscillating displacement (also referred to as oscillating vibration or oscillating movement) along the axis 217. More generally speaking, the vibrotactile haptic effect may be generated when the haptic actuator assembly generates a time-varying amount of displacement, such as a displacement that oscillates in value at a particular frequency. When the haptic actuator assembly 220 is outputting displacement, it may press against, or pull on, a sub-layer 214c of the back panel 214. The sub-layer 214c may be of a material having a suitable Young's modulus and may be sufficiently thin to be able to undergo elastic bending or other elastic deformation as a result of being acted upon by the haptic actuator assembly 220, such as by being pressed or pulled by the assembly. In other words, the sub-layer 214c of the back panel 214 may be configured to have a stiffness that permits it to bend inward and outward relative to a remainder of the back panel 214, as illustrated by the dashed lines in FIG. 4, to generate a vibrotactile haptic effect.

As discussed in more detail below, the haptic actuator assembly 220 may include a pre-load device that constrains expansion by the haptic actuator assembly along an axis, such as the axis 217. The sub-layer 214c, or more generally the back panel 214, may by itself lack sufficient stiffness to constrain expansion of the haptic actuator assembly 220. For instance, any compressive load applied to the haptic actuator assembly 220 by the sub-layer 214c, or more generally by the back panel 214, may be less than 1 N. More generally speaking, any compressive load applied to the haptic actuator assembly 220 by the housing 210 may be less than 1 N. In some cases, the housing may apply no compressive load on the haptic actuator assembly 220. In such a situation, the absence of a pre-load may allow an amount of displacement that is output from the haptic actuator of the haptic actuator assembly to be excessive, wherein the excessive displacement may reduce a force of the vibrotactile haptic effect at the outer surface 214b and may increase a risk of damage to the haptic actuator of the haptic actuator assembly 220. Thus, a pre-load device in accordance herewith may be advantageous in such an application to constrain displacement along the axis 217 of the haptic actuator assembly 220, and particularly displacement of its haptic actuator along the axis 217.

In an embodiment, a displacement that is output by the haptic actuator assembly 220 may be generated by a haptic actuator of the haptic actuator assembly. For instance, if a haptic actuator of the haptic actuator assembly 220 expands by 5 μm along the axis 217, such that the haptic actuator is outputting a displacement of 5 μm, the haptic actuator assembly 220 may also expand by 5 μm, such that the haptic actuator assembly 220 is also outputting 5 μm of displacement. Accordingly, the amount of displacement by the haptic actuator and the amount of displacement by the haptic actuator assembly 220 may be the same, or may be different.

In an embodiment, a force that is output by the haptic actuator assembly 220, such as a force exerted against the sub-layer 214c, may be equal to a force generated by a haptic actuator of the assembly 220 minus a force of any pre-load. For instance, the haptic actuator assembly 220 may generate a pre-load of 4 N. The pre-load may be a compressive load against the haptic actuator that causes, or results in, the haptic actuator generating a force that is about 20 N. In some instances, a force that is output by the haptic actuator assembly may be about 16 N.

In an embodiment, the haptic-enabled device 200 illustrated in FIG. 4 may further include a rigid component 218 that is disposed on an inner surface 214d of the back panel 214. More specifically, the rigid component 218 may be in contact with the inner surface 214d. The rigid component 218 may channel displacement from the haptic actuator assembly 220 toward the outer surface 214b of the back panel 214, rather than toward the inner surface 214d. More specifically, the rigid component 218 may be incompressible along the axis 217, such that when the haptic actuator of the haptic actuator assembly 220 expands along the axis 217, the sub-layer 214c provides much less resistance against that expansion than does the rigid component 218. As a result, most or all of the expansion of the haptic actuator of the assembly 220 may be channeled toward bending the sub-layer 214c, rather than toward compressing the rigid component 218. Examples of the rigid component 218 may include a metal frame, a printed circuit board (PCB) substrate, or a rigid battery shell.

Figure 5:
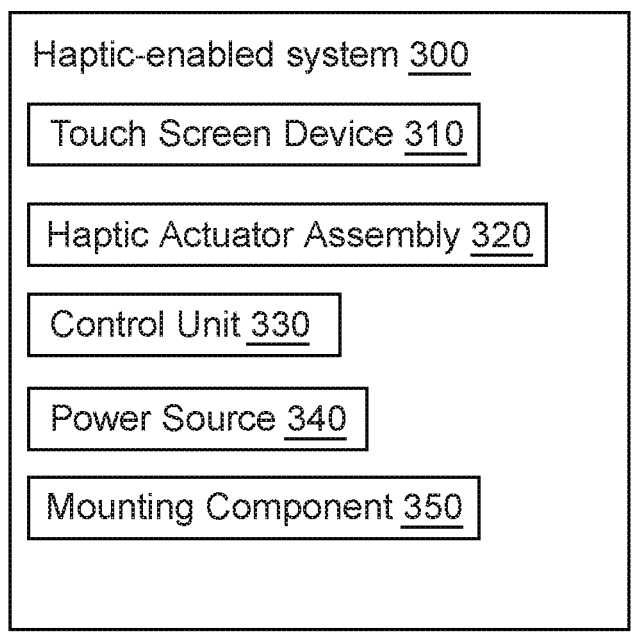
FIG. 5 depicts a block diagram of a haptic-enabled system that includes a touch screen device, a haptic actuator assembly, and a mounting component, according to an embodiment hereof.

In an embodiment, a haptic actuator assembly of the embodiments herein may be part of a haptic-enabled system, such as the haptic-enabled system 300 of FIG. 5. In an embodiment, the haptic-enabled system 300 may be a center console system for providing various in-vehicle functionality, including displaying navigation instructions, providing entertainment options, and displaying sensor data. In an embodiment, the haptic-enabled system 300 includes a touch screen device 310, a haptic actuator assembly 320, a control unit 330, a power source 340, and a mounting component 350. The control unit 330 may be similar to the control unit 130 of FIG. 1, and the power source 340 may be similar to the power source 140. The touch screen device 310 may be, for instance, a capacitive or resistive LCD or LED touch screen configured to receive touch input.

Like the haptic actuator assembly 120 or 220, the haptic actuator assembly 320 may be configured to output displacement and force to generate a haptic effect at the touch screen device 310. The haptic actuator assembly 320 may include a pre-load device to constrain displacement so that a sufficient amount of force accompanies the displacement. The touch screen device 310 may be directly or indirectly connected to a mounting component 350. In an embodiment, the mounting component 350 may be part of a body of a vehicle's center console.

Figure 6:
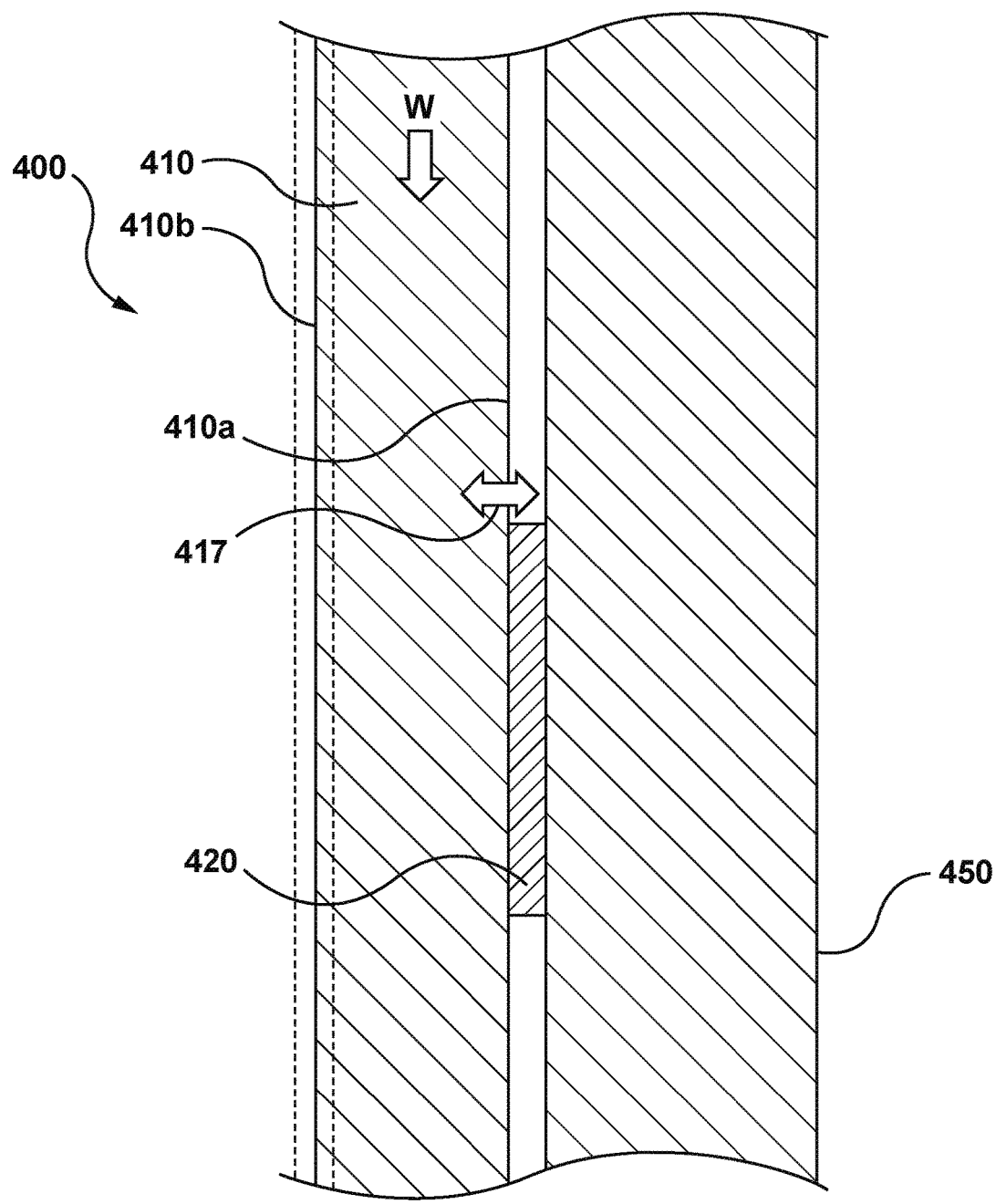
FIG. 6 depicts a haptic-enabled system that includes a touch screen device, a haptic actuator assembly, and a mounting component, according to an embodiment hereof.

FIG. 6 depicts a haptic-enabled system 400 that is an embodiment of the haptic-enabled system 300. The haptic-enabled system 400 includes a touch screen device 410, a haptic actuator assembly 420, and a mounting component 450. In an embodiment, the touch screen device 410 may have a mass of less than 10 g. The haptic actuator assembly 420 may be configured to output displacement along an axis 417. As a result, the haptic actuator assembly 420 may press/push and pull against a surface 410a of the touch screen device 410 to generate a vibrotactile haptic effect at an exterior surface 410b of the touch screen device 410. The surface 410b may be a front exterior surface facing a driver, while the surface 410a may be an opposite surface of the touch screen device 410. In an embodiment, the mounting component 450 may be a rigid component, and may have substantially more mass than the touch screen device 410, such that most or all of the displacement that is output by the haptic actuator assembly 420 is directed toward moving the touch screen device 410, rather than toward moving the mounting component 450. In an embodiment, the touch screen device 410 may be connected to the mounting component 450 via the haptic actuator assembly 420. In an embodiment, the touch screen device 410 may be connected to the mounting component 450 via a suspension that allows the touch screen 410 to move along the axis 417.

In an embodiment, the haptic actuator assembly 420 may include a pre-load device that constrains expansion of the haptic actuator assembly 420 along the axis 417. In the embodiment of FIG. 6, a weight W of the touch screen device 410 may not provide sufficient load by itself to provide a sufficient compressive load on the haptic actuator assembly 420 along the axis 417. As depicted in FIG. 6, the weight W may be insufficient because it is too low in magnitude (because the mass of the touch screen device 410 is low), and/or the weight W is acting in a direction that is partially or completely perpendicular to the axis 417. In such an application, a pre-load device in accordance herewith may be incorporated into the haptic actuator assembly 420 in order to constrain the expansion of the haptic actuator assembly.

An embodiment of a haptic actuator assembly 520 is illustrated in FIGS. 7A and 7B. The haptic actuator assembly 520 includes a haptic actuator 521 and a pre-load device 527. As depicted in FIG. 7B, the haptic actuator 521 may be configured to output displacement along an axis 517 by expanding along the axis 517. The displacement that is output by the haptic actuator 521 may become the displacement that is output by the haptic actuator assembly 520 as a whole. In an embodiment, the axis 517 may represent a thickness dimension of the haptic actuator assembly 520, and the displacement that is output by the haptic actuator assembly 520 may refer to a change in a thickness, or $\Delta t$, of the haptic actuator assembly 520 relative to, e.g., a baseline state in which the haptic actuator 521 was not activated. In an embodiment, the haptic actuator 521 may be a piezoelectric actuator.

In an embodiment, the pre-load device 527 includes at least a first component 527a and a second component 527b that are configured to generate a pre-load, which may be in the form of a compressive load, as represented by arrows 560 in FIGS. 7A and 7B, opposing expansion along the axis 517 of the haptic actuator 521 and of the haptic actuator assembly 520. The haptic actuator 521 is sandwiched or otherwise disposed between the first component 527a and the second component 527b. In an embodiment, the first component 527a and the second component 527b may be attached to opposing sides of the haptic actuator 521 via an adhesive or some other manner of attachment. In an embodiment, the first component 527a and the second component 527b may be held in contact or in close proximity to opposing sides of the haptic actuator 521 without being fixedly attached thereto. In some cases, the compressive load may be generated by a spring force or forces. As discussed below in more detail, the pre-load device 527 may include one or more spring components configured to generate a spring force(s) onto the haptic actuator 521.

Figure 8A:
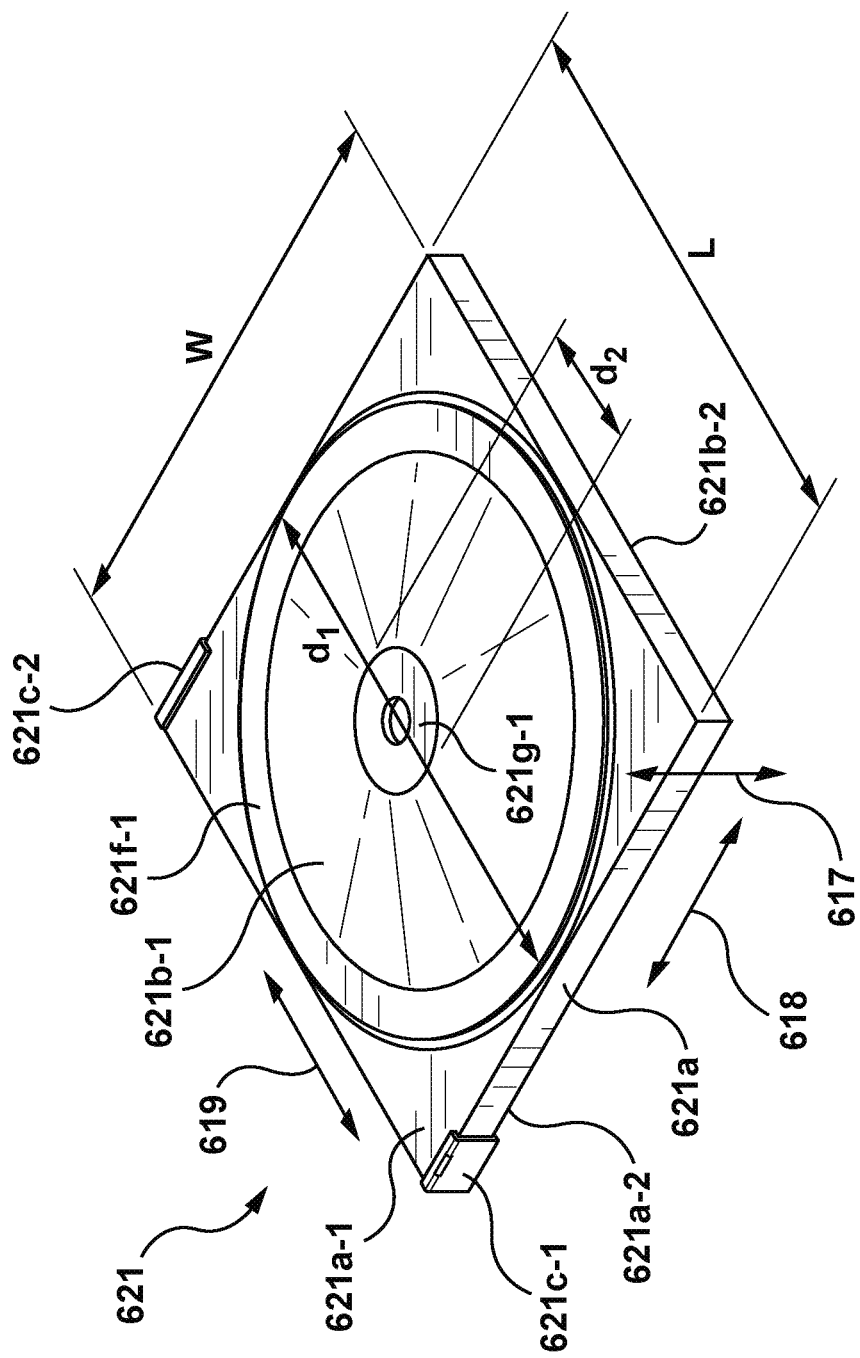
FIGS. 8A-8E depict an example haptic actuator for a haptic actuator assembly, according to an embodiment hereof.
Figure 8B:
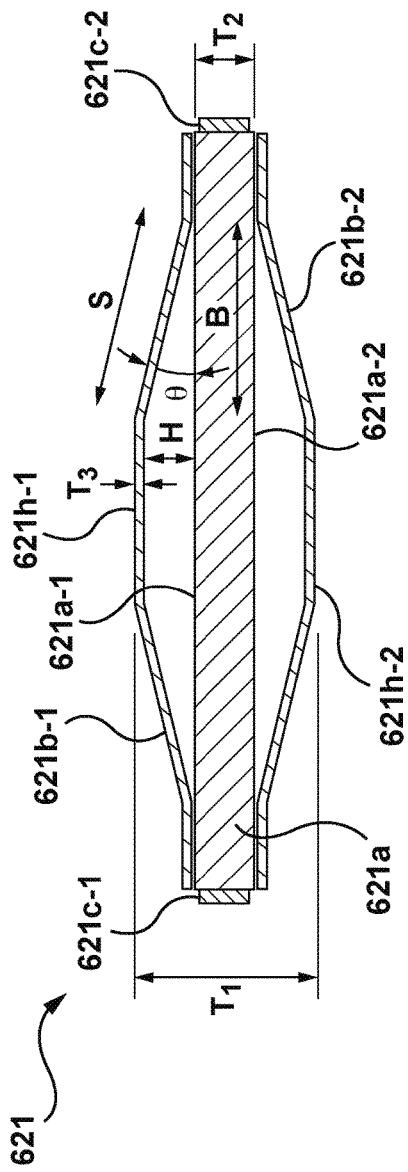

FIGS. 8A-8D illustrate a haptic actuator 621 that is an embodiment of the haptic actuator 521. In this embodiment, the haptic actuator 621 is a piezoelectric actuator that includes a layer 621a of piezoelectric material configured to generate a strain along an axis, such as axis 618 and/or axis 619, that is parallel to a planar surface (e.g., 621a-1 or 621a-2) of the layer 621a. In an embodiment, the layer 621a of piezoelectric material may have a length L that is in a range of 9 mm to 25 mm, a width W that is in a range of 9 mm to 25 mm, and a thickness $T_2$ (see FIG. 8B) that is in a range of 0.3 mm to 2 mm. In an embodiment, as depicted in FIG. 8A, the length L and the width W of the layer 621a may both be equal to each other. In an embodiment, the layer 621a of piezoelectric material is a layer of lead zirconate titanate (PZT) or other piezo ceramic material. In an embodiment, the layer 621a of piezoelectric material is a layer of polymer. In an embodiment, as illustrated in FIG. 8B, the haptic actuator 621 may have an overall thickness $T_1$ that is in a range of 1 mm to 4 mm. In an embodiment, the haptic actuator 621 may be a version of the TDK® PowerHap™ piezo actuator, such as the Miniaturized PowerHap™ 2.5G type of haptic actuator from TDK®.

Figure 8C:
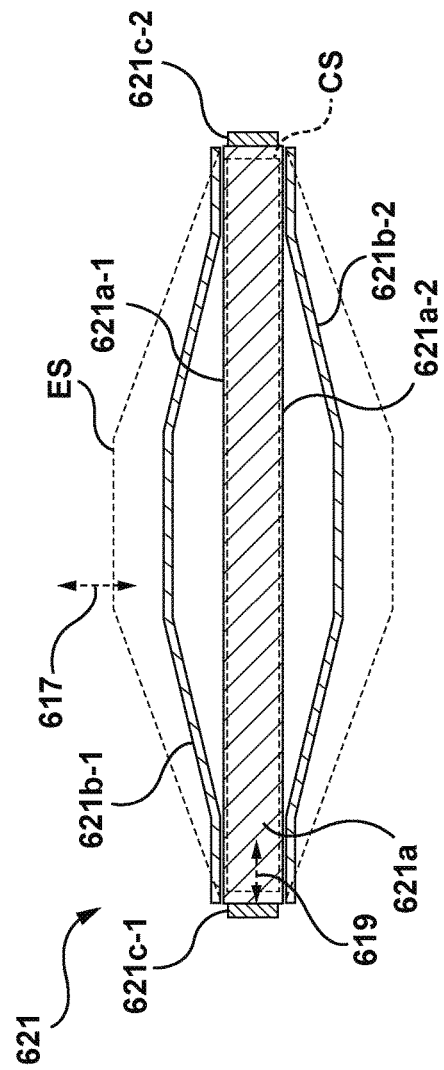

As illustrated in FIGS. 8A-8C, the haptic actuator 621 further includes a displacement conversion device 621b-1/621b-2 that is configured to convert strain along an axis, such as axis 618 or axis 619, to expansion or contraction of the haptic actuator 621 along an axis 617, which is perpendicular to the planar surface (e.g., surface 621a-1 or 621a-2) of the layer 621a of piezoelectric material. The axis 618 or 619 may be referred to as a parallel axis, while the axis 617 may be referred to as a perpendicular axis. In an embodiment, the displacement that is output by the haptic actuator 621 along the axis 617 may arise from the expansion or contraction of the haptic actuator 621 along the axis 617.

In an embodiment, the displacement conversion device 621b-1/621b-2 is a displacement amplification device configured to convert a displacement, i.e., a first amount of displacement, caused by the strain along the axis 618 or axis 619, to a greater amount of displacement, i.e., a second amount of displacement, along the axis 617, wherein the second displacement is greater than the first displacement (see FIG. 8C). The displacement that is output by the haptic actuator 621 along a particular axis may refer to, e.g., a change in a dimension of the haptic actuator 621 along that axis (e.g., change in length, width, or thickness) relative to a baseline state in which the haptic actuator 621 was not activated.

In an embodiment, the displacement amplification device includes a lever device that is configured to perform the conversion from the first displacement to the second displacement. For instance, the displacement conversion device 621b-1/621b-2 in FIGS. 8A-8C is a lever device that includes a first disc 621b-1 and a second disc 621b-2 disposed on opposite sides or opposing surfaces of the layer 621a of piezoelectric material. Each disc of the first disc 621b-1 and second disc 621b-2 may be, e.g., a metal sheet (also referred to as a metal layer) that tapers from a circular base portion (e.g., 621f-1) to a circular central portion (e.g., 621g-1) to form a truncated cone with a respective planar surface 621a-1/621a-2 of the layer 621a of piezoelectric material. The truncated cone may also be referred to as a cymbal or a truncated conical endcap. As illustrated in FIG. 8B, the truncated cone may have a sloped portion with a slope length S, wherein the sloped portion may form an angle θ with a planar surface (e.g., 621a-1) of the layer 621a of piezoelectric material. In some cases, the angle θ may have a value of less than 45° (e.g., 15°). The sloped portion may create a height H for the truncated cone. The height H may be equal to or substantially equal to a height of the first disc 621*b*-1 and/or of the second disc 621*b*-2, and may be in a range of, e.g., 0.2 mm to 0.7 mm. If the sloped portion were projected onto the planar surface 621*a*-1, it may further have a base width B. Further, each disc of the first disc 621*b*-1 and the second disc 621*b*-2 may have a thickness $T_3$ (see FIG. 8B) that is a range of 0.1 mm to 0.5 mm. As depicted in FIG. 8A, the circular base portion (e.g., 621*f*-1) of each of the discs 621*b*-1, 621-*b*2 may have a diameter $d_1$ that is in a range of 9 mm to 12 mm, while the circular central portion (e.g., 621*g*-1) of each of the discs 621*b*-1, 621*b*-2 may have a diameter $d_2$ that is in a range of 2 mm to 3 mm. The values of the dimensions discussed above are only examples, and the various dimensions presented above may have other values.

In an embodiment, the haptic actuator 621 may interface with other components (e.g., with a pre-load device) via a surface of the displacement conversion device 621*b*-1/621*b*-2. For instance, the haptic actuator 621 may interface with the pre-load device via an outer surface 621*h*-1 of a circular central portion (e.g., 261*g*-1) of disc 621*b*-1, and/or with an outer surface 621*h*-2 of a circular central portion (e.g., 261*g*-1) of disc 621*b*-2. The outer surface 621*h*-1 and the outer surface 621*h*-2 may form opposite outer surfaces (also referred to as opposing outer surfaces) of the haptic actuator 621, and may act as a first interface surface and a second interface surface, respectively, for the haptic actuator 621. In such an embodiment, a pre-load device may include a first component and a second component that are disposed on the respective opposite surfaces of the haptic actuator 621. In some cases, a layer of adhesive may be applied on the outer surfaces 621*h*-1, 621*h*-2 to adhere them to a first component and a second component of a pre-load device.

In an embodiment, as illustrated in FIGS. 8B and 8C, the haptic actuator 621 further includes electrodes 621*c*-1 and 621*c*-2. When a voltage difference is created between the electrodes 621*c*-1 and 621*c*-2, the layer 621*a* of piezoelectric material may output strain along the axis 618 and/or the axis 619. For instance, the layer 621*a* of piezoelectric material may contract along the axis 619 to a contracted state CS indicated by the dashed lines in FIG. 8C. In an embodiment, the layer 621*a* of piezoelectric material may also experience some strain along the axis 617, but to a much lesser degree than the strain along the axis 619. In an embodiment, the displacement or deformation of the layer 621*a* along the axis 619 may be in a range of 5 μm to 50 μm, while the displacement or deformation of the layer 621*a* along the axis 617 may be in a range of 0.5 μm to 2 μm. In an embodiment, the layer 621*a* may also generate strain along the axis 618. The strain along the axis 619 and the strain along the axis 618 may be the same, or may differ. The displacement conversion device 621*b*-1/621*b*-2 in FIG. 8C may convert the strain along the axis 619 to expansion of the haptic actuator 621 along the axis 617 to an expanded state ES indicated by the dashed lines in FIG. 8C. The displacement that is output by the haptic actuator 621 may come from the expansion of the haptic actuator 621.

Figure 8D:
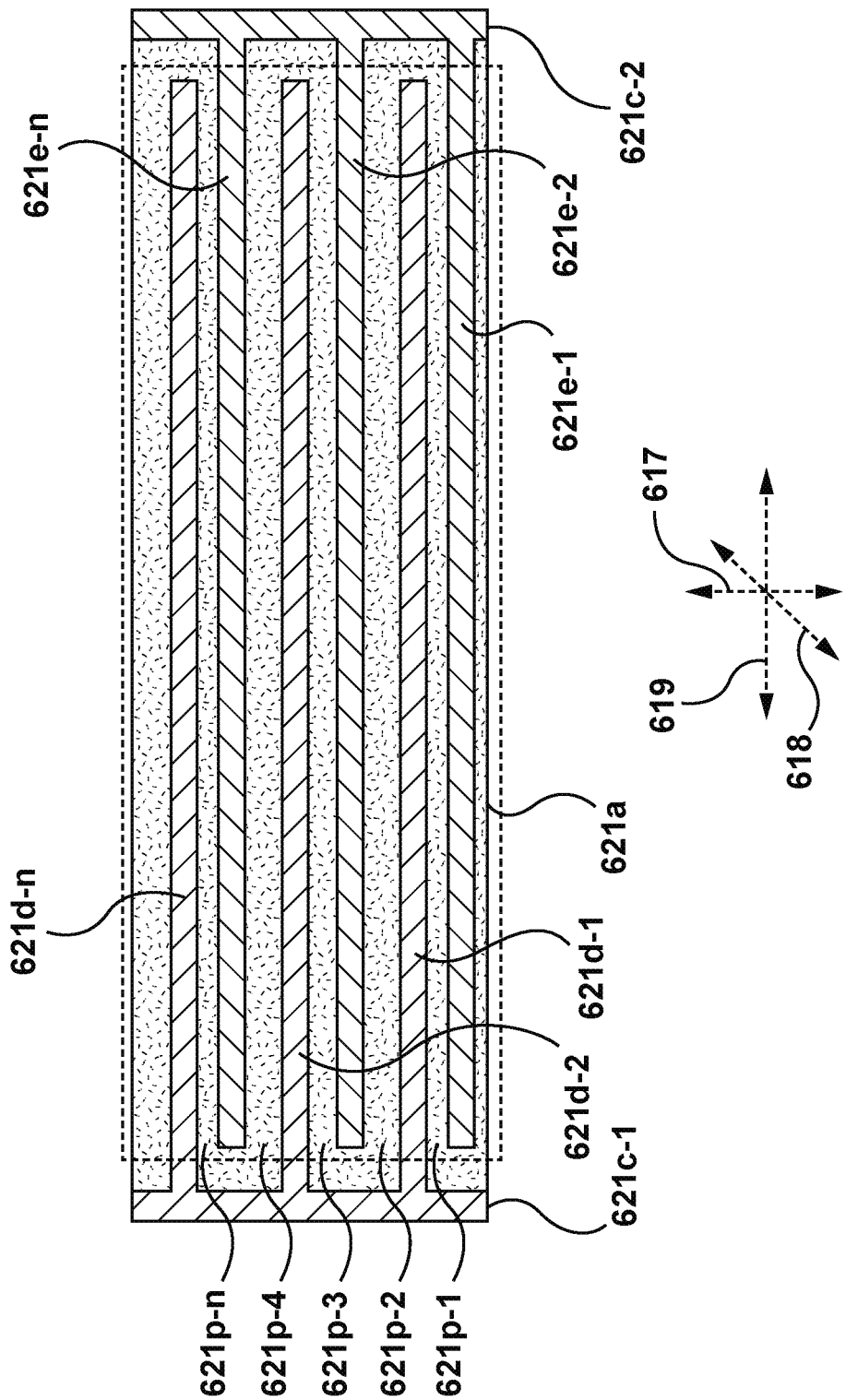

FIG. 8D illustrates an embodiment of the layer 621*a* of piezoelectric material that includes a stack of sub-layers 621*p*-1, 621*p*-2, 621*p*-3, 621*p*-4 . . . 621*p*-*n* of piezoelectric material. Further, the electrode 621*c*-1 and the electrode 621*c*-2 may form an inter-digitated or comb-like pattern. This pattern may reduce a distance between the two electrodes, which may allow a stronger electric field to be created between them. More specifically, the electrode 621*c*-1 may include a first set of electrode layers 621*d*-1, 621*d*-2 . . . 621*d*-*n* that are embedded within the layer 621*a* of piezoelectric material. Each electrode layer of the first set of electrode layers 621*d*-1 . . . 621*d*-*n* may extend substantially through a length or width of the layer 621*a*. Similarly, the electrode 621*c*-2 may include a second set of electrode layers 621*e*-1, 621*e*-2 . . . 621*e*-*n* that are also embedded within the layer 621*a* of piezoelectric material. Each electrode layer of the second set of electrode layers 621*e*-1 . . . 621*e*-*n* may extend substantially through the length or width of the layer 621*a*.

In an embodiment, each sub-layer of the plurality of sub-layers 621*p*-1 . . . 621*p*-*n* may be disposed directly between one of the first set of electrode layers 621*d*-1 . . . 621*d*-*n* and one of the second set of electrode layers 621*e*-1 . . . 621*e*-*n*, such that the two electrode layers are immediately adjacent to the sub-layer. For instance, the sub-layer 621*p*-1 is disposed directly between the electrode layer 621*d*-1 and the electrode layer 621*e*-1, wherein the electrode layer 621*d*-1 and the electrode layer 621*e*-1 are immediately adjacent to the sub-layer 621*p*-1.

In an embodiment, when a voltage difference is created between any electrode layer of the first set of electrode layers 621*d*-1 . . . 621*d*-*n* and a corresponding or adjacent electrode layer of the second set of electrode layers 621*e*-1 . . . 621*e*-*n*, the voltage difference may generate an electric field between the two electrode layers. The electric field may be aligned along the axis 617. In an embodiment, the axis 617 may be parallel with a poling direction of the piezoelectric material of each sub-layer of the plurality of sub-layers 621*p*-1 . . . 621*p*-*n*. In an embodiment, the poling direction of the piezoelectric material may be parallel with each sub-layer of the plurality of sub-layers 621*p*-1 . . . 621*p*-*n*, or more generally may be parallel with the layer 621*a*. For instance, the poling direction may be parallel with a length dimension or a width dimension of the layer 621*a*. The electric field along the axis 617 between the two electrode layers may cause a sub-layer of piezoelectric material between them to generate strain. The strain may be along one or more of the axes 617-619. For instance, FIG. 8D depicts the sub-layers 621*p*-1 . . . 621-*n* contracting along the axis 619 and expanding along the axis 617, as indicated by the dashed lines in the figure. The amount of strain along the axis 619 may be based on a value of a $d_{31}$ coefficient of the piezoelectric material, while the amount of strain along the axis 617 may be based on a value of a $d_{33}$ coefficient of the piezoelectric material. In an embodiment, the amount of strain along the axis 619 may be considerably larger than the amount of strain along the axis 617.

Figure 8E:
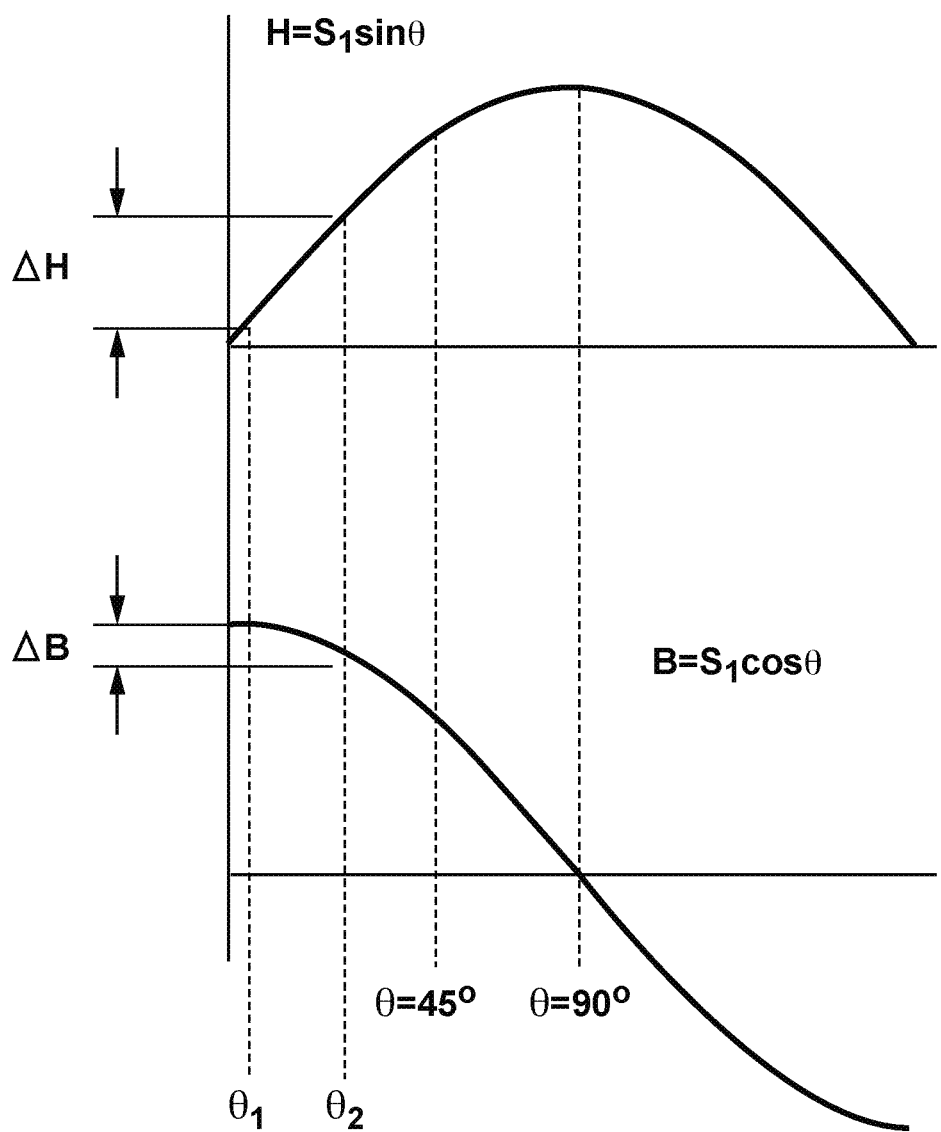

As stated above, the displacement conversion device 621*b*-1/621*b*-2 may be configured to convert the strain along the axis 619 to displacement and force along the axis 617. In an embodiment, the displacement conversion device 621*b*-1/621*b*-2 may form a plurality of linkages that are connected by joints (e.g., living hinges), and a geometry of the linkages may cause the strain along the axis 619 to be converted, and in some cases amplified, to displacement along the axis 617. For instance, FIG. 8B depicts a geometry that involves the dimensions S, H, and B, which are discussed above with respect to FIG. 8B. These dimensions may correspond to dimensions of a right triangle. As depicted in FIGS. 8B and 8C, when there is strain along the axis 619, the layer 621*a* of piezoelectric material may decrease in length or width, to the contracted state CS. As a result, the dimension B may decrease, which may force the angle θ to increase. The increase in θ may in turn increase the dimension H. The dimension S may remain the same, such as at a value of $S_1$, as θ changes. In this situation, because the dimensions of S (which equals $S_1$), B, and H correspond to those of a right triangle, the value of B may be calculated as $S_1$ cos θ, while the value of H may be calculated as $S_1$ sin θ. FIG. 8E illustrates a plot of H and B for such a situation, in which strain along the axis 619 of FIG. 8C causes a change in B (i.e., ΔB) and a change in H (i.e., ΔH). The quantity ΔB may represent a displacement along the axis 619, while the quantity ΔH may represent a displacement along the axis 617. As depicted in FIGS. 8B, 8C, and 8E, a strain that contracts the layer 621*a* to the contracted state CS may force the angle θ to increase, from $θ_1$ to $θ_2$. In FIG. 8E, both $θ_1$ to $θ_2$ are less than 45°. In such an embodiment, the increase in θ may result in a greater ΔH relative to ΔB. In other words, FIG. 8E demonstrates that a geometry such as that in FIGS. 8B and 8C may result in displacement along the axis 617 being amplified relative to displacement along the axis 619.

Figure 9:
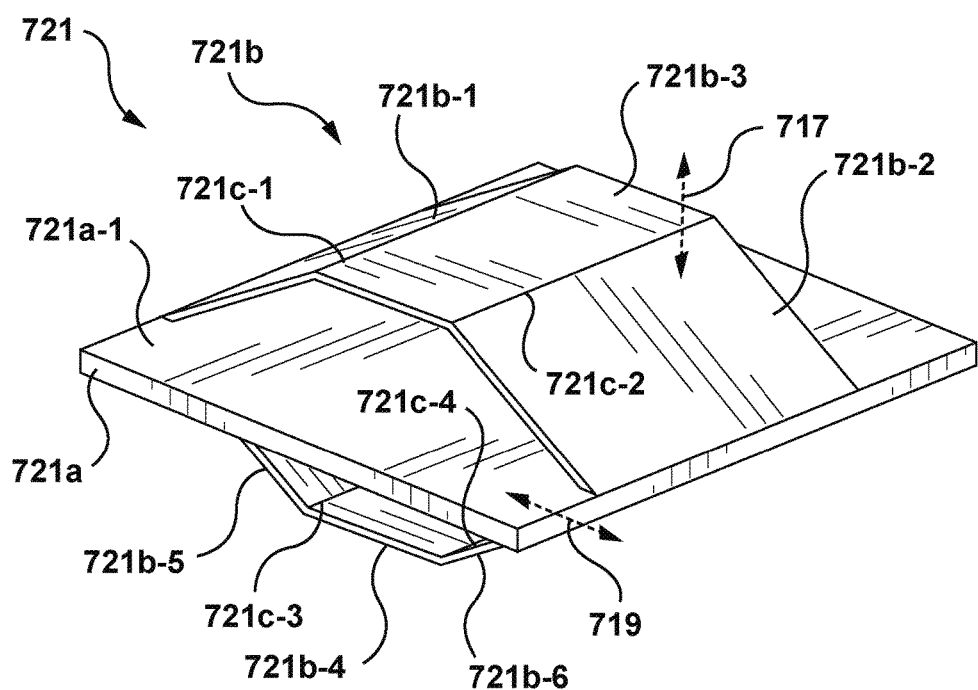
FIG. 9 depicts an example haptic actuator for a haptic actuator assembly, according to an embodiment hereof.

FIG. 9 depicts a haptic actuator 721 that is an embodiment of the haptic actuator 521. Like the haptic actuator 621, the haptic actuator 721 includes a layer 721*a* piezoelectric material. The haptic actuator 721 further includes a displacement conversion device 721*b* that is configured to generate strain along an axis 719 that is parallel to a planar surface 721*a*-1 of the layer 721*a* to displacement along an axis 717. Axis 719 may be referred to as a parallel axis, while axis 717 may be referred to as a perpendicular axis. As depicted in FIG. 9, the displacement conversion device 721*b* may form a frame that includes a pair of linkages 721*b*-1, 721*b*-2 that each act as a lever to amplify displacement along the axis 719 to a greater amount of displacement along the axis 717. The pair of linkages 721*b*-1, 721*b*-2 may be connected to a center portion 721*b*-3 by a pair of respective living hinges 721*c*-1, 721*c*-2. The frame may also include a pair of linkages 721*b*-5, 721*b*-6 that also act as levers to amplify displacement along the axis 719 to a greater amount of displacement along the axis 717. The pair of linkages 721*b*-5, 721*b*-6 may be connected to a center portion 721*b*-4 by another pair of respective living hinges 721*c*-3, 721*c*-4. The center portions 721*b*-3 and 721*b*-4 may, e.g., act as respective interface surfaces for the haptic actuator 721, and may in some cases act as respective opposing outer surfaces of the haptic actuator 721. Displacement conversion and amplification devices are also discussed in U.S. Pat. No. 9,866,149 (IMM539), entitled "Method and Apparatus for Enabling Floating Touch Screen Haptics Assemblies," the entire content of which is incorporated herein by reference.

Figure 10:
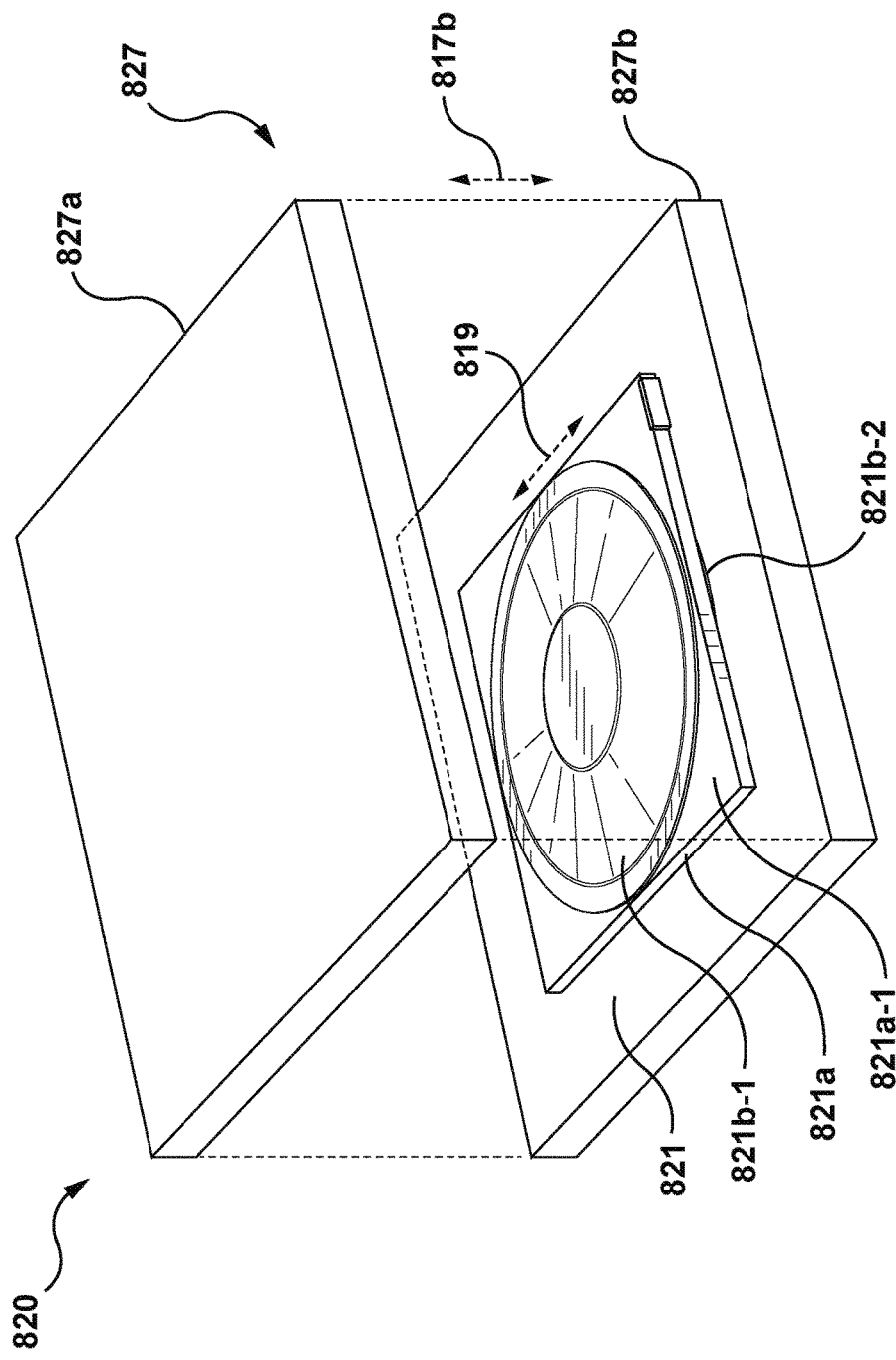
FIG. 10 depicts a haptic actuator assembly with a haptic actuator and a pre-load device, according to an embodiment hereof.

FIG. 10 depicts a partially exploded view of a haptic actuator assembly 820 that is an embodiment of any of the haptic actuator assemblies 120 through 520. The haptic actuator assembly includes a haptic actuator 821 and a pre-load device 827. In an embodiment, the haptic actuator 821 may be similar to the haptic actuator 621, and may include a layer 821*a* of piezoelectric material that is configured to generate strain along an axis 819 that is parallel to a planar surface 821*a*-1 of the layer 821*a*. The haptic actuator assembly 820 further includes a displacement conversion device that includes a first disc 821*b*-1 and a second disc 821*b*-2. Similar to the displacement conversion device 621*b*-1/621*b*-2, each of the first disc 821*b*-1 and the second disc 821*b*-2 may be a metal layer that forms a truncated cone (also referred to as a cymbal) with a respective surface of the layer 821*a* of piezoelectric material. In an embodiment, the pre-load device 827 includes a first component 827*a* and a second component 827*b* that are configured to generate a pre-load in the form of a compressive load that opposes expansion of the haptic actuator 821 along an axis 817 that is perpendicular to or substantially perpendicular to the planar surface 821*a*-1 of the layer 821*a*, and thus opposes expansion of the haptic actuator assembly 820 along the axis 817 (axis 819 may be referred to as a parallel axis, while axis 817 may be referred to as a perpendicular axis).

In an embodiment, the first component 827*a* and the second component 827*b* may be configured to generate a pre-load through one or more spring components disposed between the first component 527*a* and the second component 527*b* in order to create the compressive load. In an embodiment, the first component 827*a* and the second component 827*b* may be configured to generate a pre-load, in the form of a compressive load on the haptic actuator 821, which is in a range of 2 N to 4 N. The pre-load in a range of 2N to 4 N enables the haptic actuator 821 to reliably and predictably deform in response to an applied electrical potential. The haptic actuator 821 may break upon application of an electrical potential if it is not sufficiently pre-loaded, while conversely the haptic actuator may not be able to reliably and predictably deform if it is excessively pre-loaded.

Figure 11:
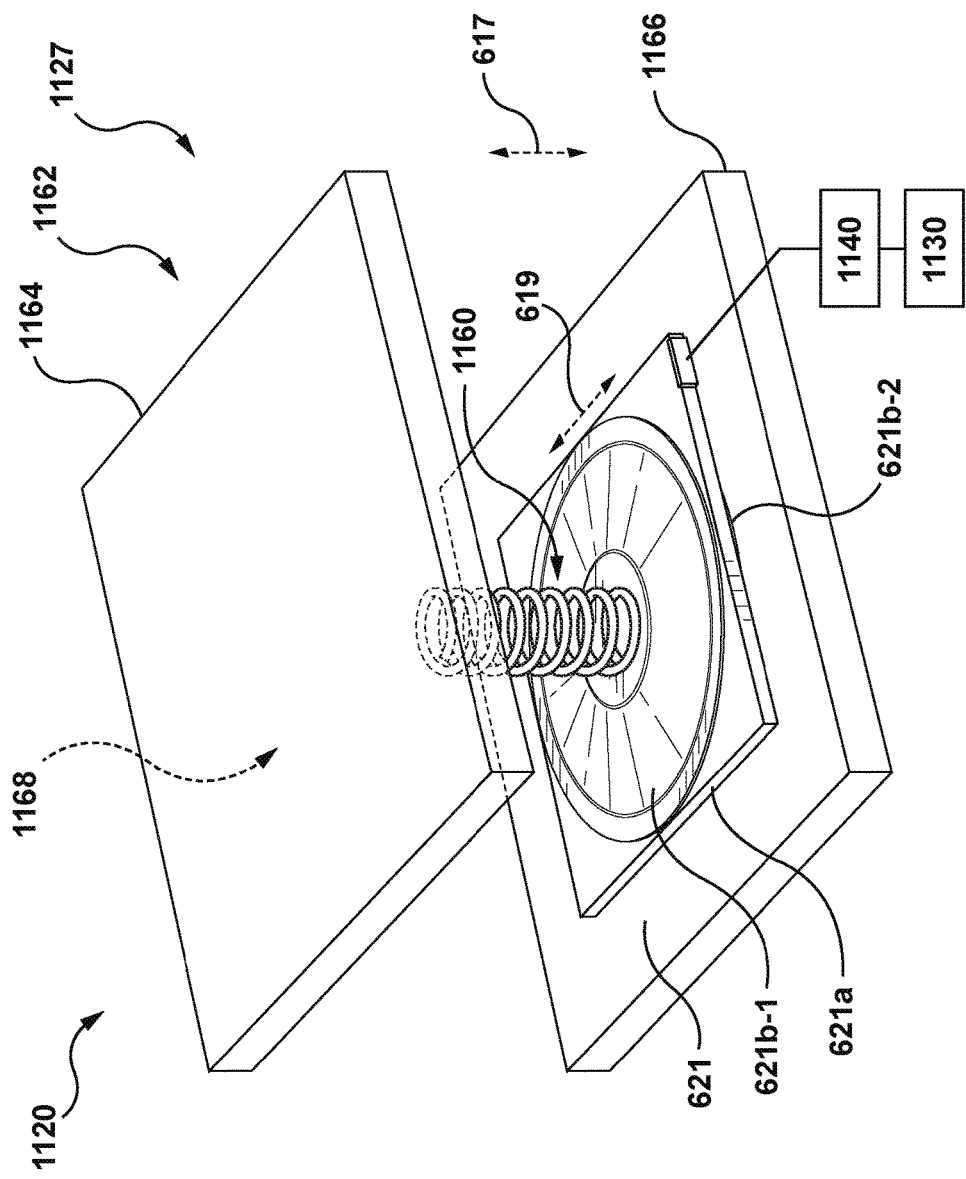
FIG. 11 depicts a perspective view of a haptic actuator assembly with a haptic actuator and a pre-load device, wherein the pre-load device includes a casing and a first spring component, according to an embodiment hereof.
Figure 12:
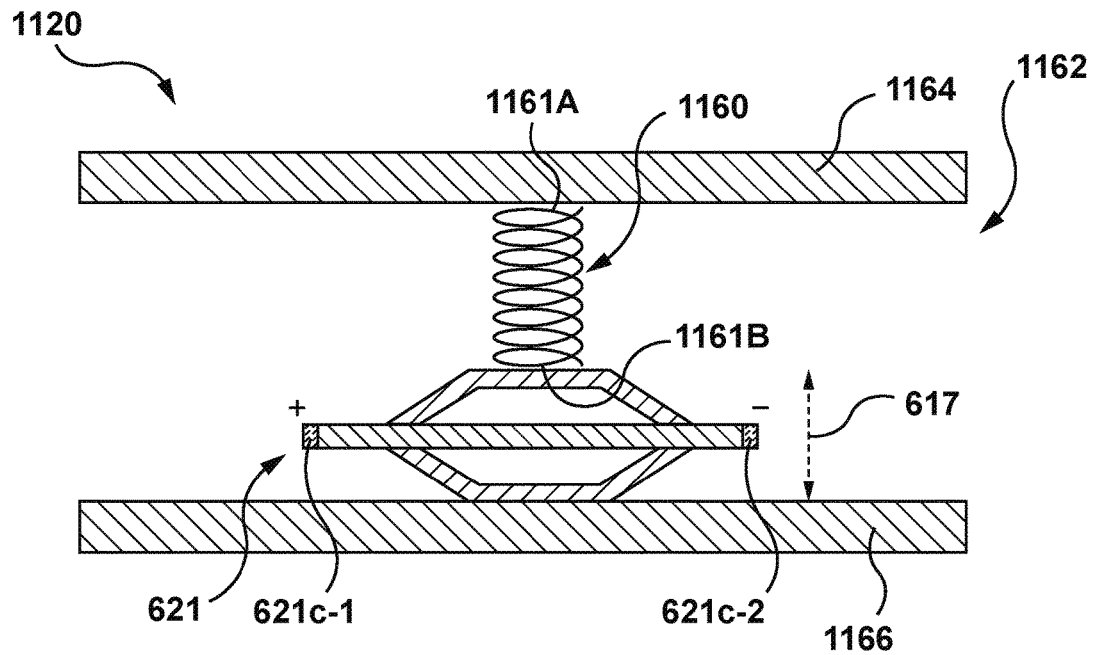
FIG. 12 depicts a sectional side view of the haptic actuator assembly of FIG. 11.

FIGS. 11 and 12 illustrate an embodiment in which the pre-load, or more specifically a compressive load, is created by a spring component 1160. More specifically, FIGS. 11 and 12 illustrate perspective and sectional side views, respectively, of a haptic actuator assembly 1120 that includes the haptic actuator 621 previously described above as well as a pre-load device 1127. Although the haptic actuator assembly 1120 is shown and described with the haptic actuator 621, any haptic actuator described herein may also be utilized with the pre-load device 1127. The pre-load device 1127 is configured to create a compressive load on the haptic actuator 621 along the axis 617, and the compressive load opposes expansion, or more generally deformation, of the haptic actuator 621 along the axis 617.

The pre-load device 1127 includes the spring component 1160 and a casing 1162. In an embodiment, the casing 1162 includes a cover 1164 and a base 1166 that opposes the cover 1164. In an embodiment, the cover 1164 is spaced apart from but extends generally parallel to the base 1166. In an embodiment, the casing 1162 may be formed from a material that is light weight yet strong, such as acrylonitrile butadiene styrene (ABS), polycarbonate, polypropylene, polyurethane or other polymeric material. The cover 1164 and the base 1166 may be planar components that have the same size and shape (e.g., rectangular or circular shape), or may have different sizes and/or shapes. In some instances, the cover 1164 and the base 1166 may each be rectangular, and may each have a length and a width that are each in a range of 9 mm to 25 mm. In an embodiment, the cover 1164 and the base 1166 each have a thin profile in order to keep a low overall thickness for the haptic actuator assembly 1120. For instance, the cover 1164 and the base 1166 may each have a thickness that is in a range of 1 mm to 2 mm. In an embodiment, the casing 1162 may have an overall thickness that is in a range of 1 mm to 5 mm.

The casing 1162 holds or retains the spring component 1160 and the haptic actuator 621, including both the layer 621*a* of piezoelectric material and the displacement conversion device 621*b*-1/621*b*-2. The haptic actuator 621 is disposed within the casing 1162 between the cover 1164 and the base 1166, with the cover 1164 and the base 1166 being disposed at respective opposite ends of the haptic actuator 621 along the axis 617 thereof. In the embodiment of FIGS. 11 and 12, the base 1166 supports the haptic actuator 621, or stated another way the haptic actuator 621 is disposed on an interior surface of the base 1166. In an embodiment, the base 1166 may be attached to the haptic actuator 621 via an adhesive or some other manner of attachment.

In addition to the pre-load functions described in more detail herein, the casing 1162 functions to provide the haptic actuator assembly 1120 as a self-contained device in which the pre-load generated thereby is a load that is, e.g., built into the haptic actuator assembly 1120 or internal to the haptic actuator assembly 1120. As such, the pre-load generated by the pre-load device 1127 may be a load that is independent of user interaction or influences that are external to the haptic actuator assembly 1120. For example, the haptic actuator assembly 1120 having the pre-load device 1127 may be disposed at a location at which the haptic actuator assembly 1120 will experience little to no external load. For instance, the haptic actuator assembly 1120 may be disposed at a back side of a mobile phone, such as on an inner surface of a back panel of the mobile phone as described above with respect to FIG. 3B. The back panel may have a low mass, and may exert less than 1 N of external load on the haptic actuator assembly 1120.

In an embodiment, the casing 1162 may include one or more sidewalls (not shown) extending between the cover 1164 and the base 1166. In an embodiment, the sidewalls permit movement between the cover 1164 and the base 1166 and therefore function similar to a suspension system that is configured to allow preferential movement of the cover 1164 and/or the base 1166 along a certain axis, such as along the perpendicular axis 617. In another embodiment, the casing 1162 may include one or more partial sidewalls (not shown) that do not extend the full length between the cover 1164 and the base 1166. The partial sidewalls may, for example, extend from the cover 1164 towards the base 1166 or may extend from the base 1166 towards the cover 1164. In yet another embodiment, the casing 1162 may include one or more one or more connectors or columns extending between the cover 1164 and the base 1166. Sidewalls, partial sidewalls, and/or connectors/columns of the casing 1162 may assist in forming the haptic actuator assembly 1120 as a self-contained device.

Figure 14:
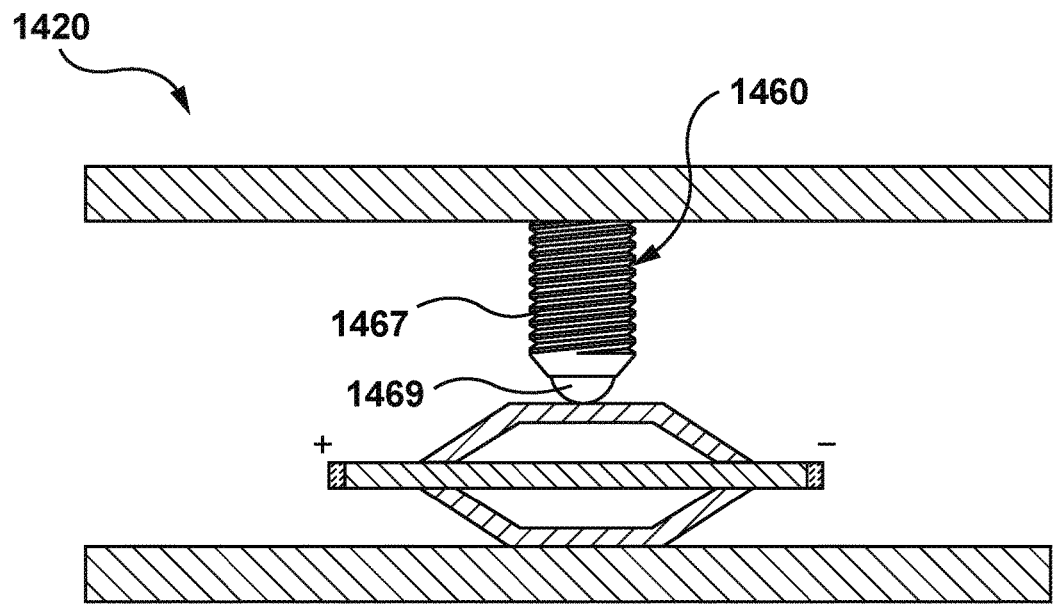
FIG. 14 depicts a perspective view of a haptic actuator assembly with a haptic actuator and a pre-load device, wherein the pre-load device includes a casing and a first spring component that includes a spring plunger, according to an embodiment hereof.
Figure 15:
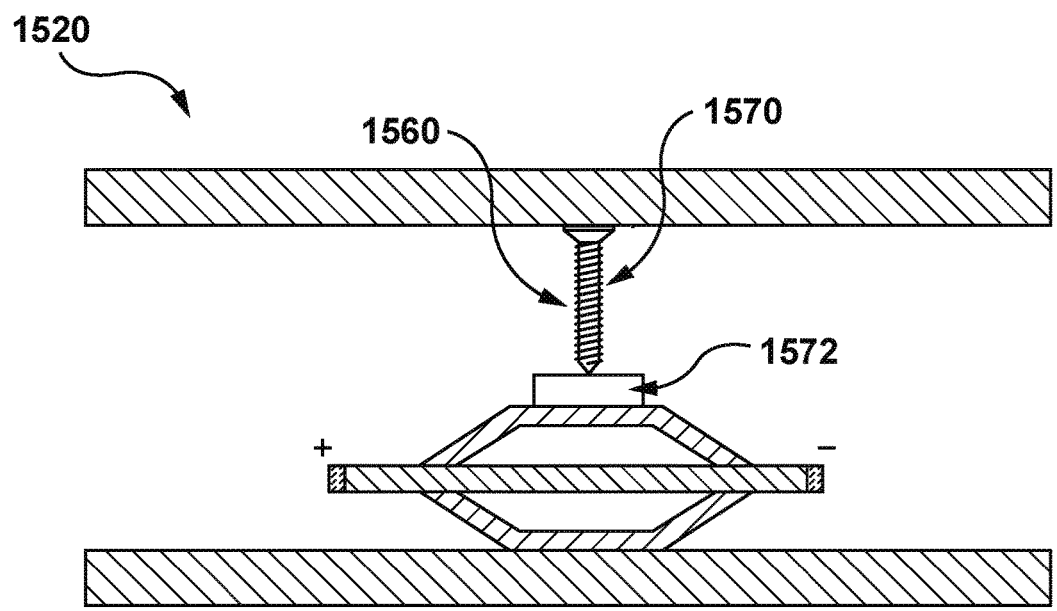
FIG. 15 depicts a perspective view of a haptic actuator assembly with a haptic actuator and a pre-load device, wherein the pre-load device includes a casing and a first spring component that includes a screw and a flexible film component, according to an embodiment hereof.

The spring component 1160 is disposed within the casing 1162 such that a first end 1161A is coupled to an interior surface of the cover 1164 and a second opposing end 1161B is coupled to an outer surface of the haptic actuator 621. The spring component 1160 is configured to create a compressive load on the haptic actuator 621 along the axis 617, and the compressive load opposes expansion of the haptic actuator 621 along the axis 617. The spring component 1160 is shown as a helical element for illustrative purposes only to represent the functional operation of the spring component 1160 and is not intended to limit an actual physical shape thereof. The spring component 1160 may be any type of spring element having the spring properties to exert the desired compressive force, including but not limited to elastomers, helical or coiled springs, leaf springs, flat springs, wave washers, snap dome springs, or a compliant element such as rubber, foam, or flexures. For example, FIG. 14 depicts a haptic actuator assembly 1420 including a spring component 1460 that is an embodiment of the spring component 1160. In FIG. 14, the spring component 1460 is a spring plunger or other spring-loaded device that increases the spring force of a spring by encapsulating it in a body 1467 and providing a plunger tip or ball 1469 on one end to enable accurate and repeatable end force. As another example, FIG. 15 depicts a haptic actuator assembly 1520 including a spring component 1560 that is an embodiment of the spring component 1160. In FIG. 15, the spring component 1560 includes a screw 1570 and a flexible film component 1572 that has the spring properties to exert the desired compressive force. The screw 1570 may be used to adjust a spring force of the flexible film component 1572. More particularly, as the screw 1570 is further advanced onto the flexible film component 1572, the spring force exerted by the flexible film component 1572 onto the haptic actuator 621 is further increased. Conversely, if it is desired to decrease the amount of spring force exerted onto the haptic actuator 621 by the flexible film component 1572, the screw 1570 may be retracted. Although there is a single spring component illustrated in each of FIGS. 11 and 12, it should be understood that in some implementations, multiple spring components may be used in the haptic actuator assembly 1120 to exert the desired compressive force.

To generate a pre-load, the cover 1164 urges the spring component 1160 against the haptic actuator 621 to apply a compressive force against haptic actuator 621. In an embodiment, the spring component 1160 may be configured to generate a pre-load that is in a range of 2 N to 4 N. The pre-load in a range of 2 N to 4 N enables the haptic actuator 621 to reliably and predictably deform in response to an applied electrical potential. When the haptic actuator 621 deforms in response to an applied electrical potential, the spring component 1160 exerts a spring force on the haptic actuator 621 that constrains the displacement from the haptic actuator 621 to a value that is a fraction (e.g., ½, ¾) of its rated displacement. By decreasing the displacement output from the haptic actuator 621, the spring component 1160 causes an increase in the force output by the haptic actuator 621. As a result, when a vibrotactile haptic effect is generated by the haptic actuator assembly 1120, the force accompanying the vibrotactile haptic effect may be stronger and more perceivable relative to the situation in which the vibrotactile haptic effect is generated by a haptic actuator having no pre-load.

FIG. 11 further illustrates a power source 1140 that may provide power to the haptic actuator assembly 1120. The power source 1140 is an embodiment of the power source 140 described above. In an embodiment, electrical leads electrically connect the power source 1140 to electrodes 621$c$-1/621$c$-2 of the haptic actuator 621. The power source 1140 may be controlled by a control unit 1130 to provide a drive signal, such as a voltage signal or a drive signal, to electrodes 621$c$-1/621$c$-2 of the haptic actuator 621. The control unit 1130 is an embodiment of the control unit 130 described above. In an embodiment, the control unit 1130 may control the power source 1140 to provide a sinusoidal drive signal to the haptic actuator assembly 1120, which may cause the haptic actuator 621 to output an oscillating displacement, such as a vibration, along the axis 617. In an embodiment, the sinusoidal drive signal may have a peak-to-peak amplitude that is in a range of, e.g., 60 V to 120 V, and a frequency that is in a range of 50 Hz to 200 Hz. The pre-load device 1127 may generate a compressive load that is in a range of, e.g., 2 N to 4 N to oppose expansion, or more generally displacement, by the haptic actuator 621 along the axis 617. As described above, by decreasing the displacement output from the haptic actuator 621, the pre-load device 1127 causes an increase in the force output by the haptic actuator 621 and thereby causes or creates a more perceivable haptic effect. The voltage signal or drive signal may be adjusted by varying the applied voltage or current, thereby controlling the force applied by the haptic actuator assembly 1120.

In an embodiment, the haptic actuator assembly 1120 can function as a harmonic oscillator that runs at a relatively high frequency. In operation, when the power source 1140 provides a sinusoidal drive signal to the haptic actuator assembly 1120, the haptic actuator 621 vibrates as directed by the oscillating drive signal. More particularly, as described above with respect to the operation of the haptic actuator 621, the displacement that is output by the haptic actuator 621 along the axis 617 may come from the expansion or contraction of the haptic actuator 621. In an embodiment, displacement of the haptic actuator 621 along the axis 617 causes movement or vibration of both the cover 1164 and the base 1166. In another embodiment, one of the cover 1164 or the base 1166 is configured to act as a mechanical ground as described in more detail below such that displacement of the haptic actuator 621 along the axis 617 causes movement or vibration of only the other opposing structure that is not configured to be a mechanical ground. The haptic actuator assembly 1120 thus vibrates and provides haptic sensations to the housing or part of the haptic-enabled device to which it is attached.

As stated above, in an embodiment hereof, one of the cover 1164 or the base 1166 may be configured to act as a mechanical ground while the other structure vibrates/displaces. For example, in the embodiment of FIG. 11, the cover 1164 which is attached to the spring component 1160 may be configured to act as a mechanical ground via the spring properties of the spring component 1160. When spring component 1160 is selected to be sufficiently stiff, the cover 1164 acts as a mechanical ground and thereby translate the force generated by the haptic actuator 621 to the base 1166. Stated another way, the mechanical ground functions to essentially channel displacement from the haptic actuator assembly 1120 toward the base 1166 rather than the cover 1164. The spring component 1160 may be incompressible along the axis 617, such that when the haptic actuator 621 expands along the axis 617, the base 1164 provides much less resistance against that expansion than does the spring component 1160. As a result, most or all of the expansion of the haptic actuator 621 may be channeled toward vibrating or displacing the base 1166, rather than toward the cover 1164.

Alternatively, in another embodiment, the base 1166 may be configured to act as a mechanical ground and thereby translate the force generated by the haptic actuator 621 to the spring component 1160 and the cover 1164. The spring component 1160 may be compressible along the axis 617, such that when the haptic actuator 621 expands along the axis 617, the spring component 1160 and the cover 1164 provide much less resistance against that expansion than does the base 1164. As a result, most or all of the expansion of the haptic actuator 621 may be channeled toward vibrating or displacing the cover 1164, rather than toward the base 1166. The base 1166 may be of a relatively stiffer material having a suitable Young's modulus and/or thickness to be configured to act as a mechanical ground.

In an embodiment, the components of the haptic actuator assembly 1120 can be chosen to provide more effective haptic sensations and the resonant frequency of the haptic actuator assembly 1120 is tailored via the spring component 1160. The haptic actuator 621 has a first resonant frequency and the haptic actuator assembly 1120 has a second resonant frequency, the second resonant frequency being different than the first resonant frequency. The second resonant frequency is a function of or is determined via a spring constant of the first spring component 1160. For example, if the haptic actuator 621 oscillates at a natural frequency of the haptic actuator assembly 1120 (including the haptic actuator 621 as well as the pre-load device 1127), then stronger forces and more effective haptic sensations can be output. More particularly, when the power source 1140 provides a drive signal to the haptic actuator assembly 1120 and the drive signal is a periodic signal having a frequency equal to a resonant frequency of the haptic actuator assembly 1120, the haptic actuator assembly 1120 resonates to provide more effective haptic sensations. Due to the addition of the spring component 1160, the total spring constant of the haptic actuator assembly 1120 is different than the spring constant of the haptic actuator 621 alone. As such, the resonant frequency of the haptic actuator assembly 1120 varies depending on the spring constant of the spring component 1160 and the resonant frequency of the haptic actuator assembly 1120 may be controlled by selecting a particular or predetermined spring component 1160. Stated another way, the spring component 1160 may be chosen to change or alter the resonant frequency of the haptic actuator 621 alone such that the haptic actuator assembly 1120 has a desired or predetermined resonant frequency in order to amplify the output force and effects. By controlling the resonant frequency, the haptic actuator assembly 1120 may be configured to resonate at a certain frequency to present a wide spectrum of frequencies by amplitude modulation techniques. The haptic actuator assembly 1120 thus may be configured to realize mechanical resonance as described above when the drive signal has a frequency equal to a resonant frequency of the haptic actuator assembly 1120.

In addition to tuning or tailoring the resonant frequency of the haptic actuator assembly 1120 via the spring component 1160, additional mass may be included on the base 1166 (or the cover 1164 if the base 1166 is configured to be the mechanical base and the cover 1164 is configured to resonate) to ensure that the base 1166 has sufficient acceleration in the resonant frequency. Additional mass may be included on the base 1166 by attaching a separate component of a predetermined mass to the base 1166, or by forming the base 1166 to have the predetermined mass.

Figure 13:
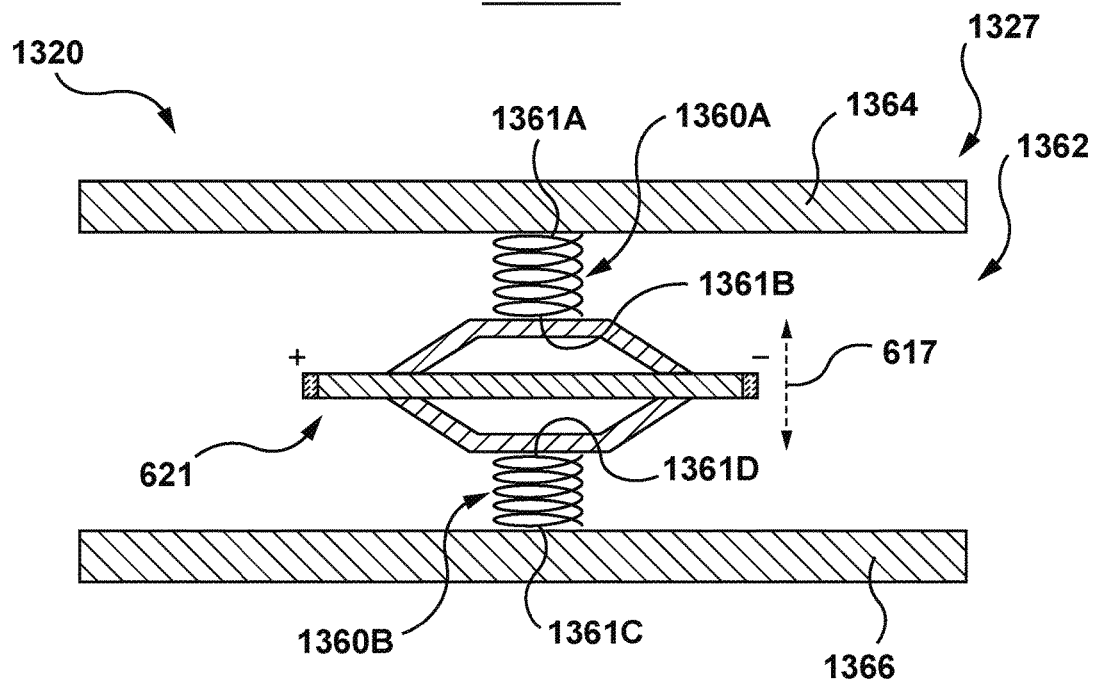
FIG. 13 depicts a sectional side view of a haptic actuator assembly with a haptic actuator and a pre-load device, wherein the pre-load device includes a casing, a first spring component and a second spring component, according to an embodiment hereof.

FIG. 13 illustrates an embodiment in which the pre-load, or more specifically a compressive load, is created by a first spring component 1360A and a second spring component 1360B. More specifically, FIG. 13 illustrates a sectional side view of a haptic actuator assembly 1320 that includes the haptic actuator 621 previously described above as well as a pre-load device 1327. Although the haptic actuator assembly 1320 is shown and described with the haptic actuator 621, any haptic actuator described herein may also be utilized with the pre-load device 1327. The pre-load device 1327 is configured to create a compressive load on the haptic actuator 621 along the axis 617, and the compressive load opposes expansion, or more generally deformation, of the haptic actuator 621 along the axis 617.

The pre-load device 1327 includes the first spring component 1360A, the second spring component 1360B and a casing 1362. The casing 1362 is similar to the casing 1162 described above and includes a cover 1364 and a base 1366 spaced apart from and extending parallel to the cover 1364. The casing 1362 holds or retains the first spring component 1360A, the second spring component 1360B, and the haptic actuator 621, including both the layer 621a of piezoelectric material and the displacement conversion device 621b-1/621b-2. The haptic actuator 621 is disposed between the cover 1364 and the base 1366, with the cover 1364 and the base 1366 being disposed at respective opposite ends of the haptic actuator 621 along the axis 617. In this embodiment, however, the haptic actuator 621 does not contact the cover 1364 or the base 1366 but rather is suspended between the cover 1364 and the base 1366 via the first spring component 1360A and the second spring component 1360B as will be described in more detail below.

As described above with respect to casing 1162, the casing 1362 functions to provide the haptic actuator assembly 1320 as a self-contained device in which the pre-load generated thereby is a load that is, e.g., built into the haptic actuator assembly 1320 or internal to the haptic actuator assembly 1320. As such, the pre-load generated by the pre-load device 1327 may be a load that is independent of user interaction or influences that are external to the haptic actuator assembly 1320. For example, the haptic actuator assembly 1320 having the pre-load device 1327 may be disposed at a location at which the haptic actuator assembly 1320 will experience little to no external load. For instance, the haptic actuator assembly 1320 may be disposed at a back side of a mobile phone, such as on an inner surface of a back panel of the mobile phone as described above with respect to FIG. 3B. The back panel may have a low mass, and may exert less than 1 N of external load on the haptic actuator assembly 1120.

More particularly, the first spring component 1360A is disposed within the casing 1362 such that a first end 1361A is coupled to an interior surface of the cover 1364 and a second opposing end 1361B is coupled to an outer surface of the haptic actuator 621. The second spring component 1360B is disposed within the casing 1362 such that a first end 1361C is coupled to an interior surface of the base 1366 and a second opposing end 1361D is coupled to an outer surface of the haptic actuator. Collectively, the first spring component 1360A and the second spring component 1360B are configured to create a compressive load on the haptic actuator 621 along the axis 617, and the compressive load opposes expansion of the haptic actuator 621 along the axis 617. The first spring component 1360A and the second spring component 1360B are shown as helical elements for illustrative purposes only to represent the functional operation thereof and the depiction is not intended to describe or limit an actual physical shape thereof. The first spring component 1360A and the second spring component 1360B may be any type of spring element having the spring properties to exert the desired compressive force, including but not limited to elastomers, helical or coiled springs, leaf springs, flat springs, wave washers, snap dome springs, or a compliant element such as rubber, foam, or flexures. Further, although there is a single spring element illustrated in FIG. 13 for each of the first spring component 1360A and the second spring component 1360B, it should be understood that in some implementations, multiple spring components may be used for each of the first spring component 1360A and the second spring component 1360B to exert the desired compressive force.

To generate a pre-load, the cover 1364 urges the first spring component 1360A against the haptic actuator 621 while the base 1366 urges the second spring component 1360B against the haptic actuator 621 to collectively apply a compressive force against haptic actuator 621. In an embodiment, first spring component 1360A and the second spring component 1360B may be configured to collectively generate a pre-load that is in a range of 2 N to 4 N. The pre-load in a range of 2 N to 4 N enables the haptic actuator 621 to reliably and predictably deform in response to an applied electrical potential. When the haptic actuator 621 deforms in response to an applied electrical potential, the first spring component 1360A and the second spring component 1360B each exert a spring force on the haptic actuator 621 that constrains the displacement from the haptic actuator 621 to a value that is a fraction (e.g., ½, ¾) of its rated displacement. By decreasing the displacement output from the haptic actuator 621, the first spring component 1360A and the second spring component 1360B collectively cause an increase in the force output by the haptic actuator 621. As a result, when a vibrotactile haptic effect is generated by the haptic actuator assembly 1320, the force accompanying the vibrotactile haptic effect may be stronger and more perceivable relative to the situation in which the vibrotactile haptic effect is generated by a haptic actuator having no pre-load.

Similar to the haptic actuator assembly 1120, the haptic actuator assembly 1320 can function as a harmonic oscillator that runs at a relatively high frequency and operates similar to the haptic actuator assembly 1120. In operation, when a power source (not shown in FIG. 13) provides a sinusoidal drive signal to the haptic actuator assembly 1320, the haptic actuator 621 vibrates as directed by the oscillating drive signal. More particularly, as described above with respect to the operation of the haptic actuator 621, the displacement that is output by the haptic actuator 621 along the axis 617 may come from the expansion or contraction of the haptic actuator 621. In an embodiment, displacement of the haptic actuator 621 along the axis 617 causes movement or vibration of both the cover 1364 and the base 1366. In another embodiment, one of the cover 1364 or the base 1366 is configured to act as a mechanical ground as described in more detail below such that displacement of the haptic actuator 621 along the axis 617 causes movement or vibration of only the other opposing structure that is not configured to be a mechanical ground. The haptic actuator assembly 1320 thus vibrates and provides haptic sensations to the housing or part of the haptic-enabled device to which it is attached.

As stated above, in an embodiment hereof, one of the cover 1364 or the base 1366 may be configured to act as a mechanical ground while the other structure vibrates/displaces. For example, in the embodiment of FIG. 13, the cover 1364 which is attached to the first spring component 1360A may be configured to act as a mechanical ground via the spring properties of the first spring component 1360A. When first spring component 1360A is selected to be sufficiently stiff, the cover 1364 acts as a mechanical ground and thereby translate the force generated by the haptic actuator 621 to the second spring component 1360A (which is compressible along the axis 617) and the base 1366 attached thereto. Stated another way, the mechanical ground functions to essentially channel displacement from the haptic actuator assembly 1320 toward the base 1366 rather than the cover 1364. The first spring component 1360A may be incompressible along the axis 617, such that when the haptic actuator 621 expands along the axis 617, the second spring component 1360A and the base 1366 attached thereto provides much less resistance against that expansion than does the first spring component 1360. As a result, most or all of the expansion of the haptic actuator 621 may be channeled toward vibrating or displacing the base 1366, rather than toward the cover 1364. In another embodiment hereof, the base 1366 which is attached to the second spring component 1360B may be configured to act as a mechanical ground via the spring properties of the second spring component 1360B.

In an embodiment, the components of the haptic actuator assembly 1320 can be chosen to provide more effective haptic sensations. More particularly, the spring constants of the first spring component 1360A and the second spring component 1360B may be different from each other. For example, as described above, the spring constants of the first spring component 1360A and the second spring component 1360B may be different from each other and may be configured such that one of the cover 1364 or the base 1366 is configured to act as a mechanical ground and displacement of the haptic actuator 621 along the axis 617 causes movement or vibration of only the other opposing structure that is not configured to be a mechanical ground. When the haptic actuator assembly 1320 is disposed underneath of a touchscreen of a mobile device, for example, such differential spring constants that provide a mechanical ground via the second spring component 1360B while permitting movement or vibration via the first spring component 1360A will essentially suspend the touchscreen and permit the haptic effects to be felt by the user.

In addition, in an embodiment, the spring constants of the first spring component 1360A and the second spring component 1360B may be different from each other and may be configured such that the haptic actuator assembly 1320 is configured to realize mechanical resonance. Stated another way, the resonant frequency of the haptic actuator assembly 1320 is tailored via the first spring component 1360A and the second spring component 1360B. The haptic actuator 621 has a first resonant frequency and the haptic actuator assembly 1320 has a second resonant frequency, the second resonant frequency being different than the first resonant frequency. The second resonant frequency is a function of or is determined via the spring constants of the first spring component 1360A and the second spring component 1360B. Due to the addition of the first spring component 1360A and the second spring component 1360B, the total spring constant of the haptic actuator assembly 1320 is different than the spring constant of the haptic actuator 621 alone. As such, the resonant frequency of the haptic actuator assembly 1320 varies depending on the spring constants of each of the first spring component 1360A and the second spring component 1360B and the resonant frequency of the haptic actuator assembly 1320 may be controlled by selecting particular or predetermined spring components 1360A, 1360B. Stated another way, the first spring component 1360A and the second spring component 1360B may be chosen to change or alter the resonant frequency of the haptic actuator 621 alone such that the haptic actuator assembly 1320 has a desired or predetermined resonant frequency in order to amplify the output force and effects. By controlling the resonant frequency, the haptic actuator assembly 1320 may be configured to resonate at a certain frequency to present a wide spectrum of frequencies by amplitude modulation techniques. Utilizing two spring components in the haptic actuator assembly 1320 (i.e., the first spring component 1360A and the second spring component 1360B) allows for a wide range of possibilities for tailoring the resonant frequency of the haptic actuator assembly 1320 since two spring components contribute to the overall stiffness of the system. Stated another way, the resonant frequency of the system is a function of the overall stiffness of the system, which can be tuned or tailored by various combinations of spring constants of the first spring component 1360A and the second spring component 1360B.

In addition to tuning or tailoring the resonant frequency of the haptic actuator assembly 1320 via the first spring component 1360A and the second spring component 1360B, additional mass may be included on the base 1366 (or the cover 1364 if the base 1366 is configured to be the mechanical base and the cover 1364 is configured to resonate) to ensure that the base 1366 has sufficient acceleration in the resonant frequency. Additional mass may be included on the base 1366 by attaching a separate component of a predetermined mass to the base 1366, or by forming the base 1366 to have the predetermined mass.

Figure 16A:
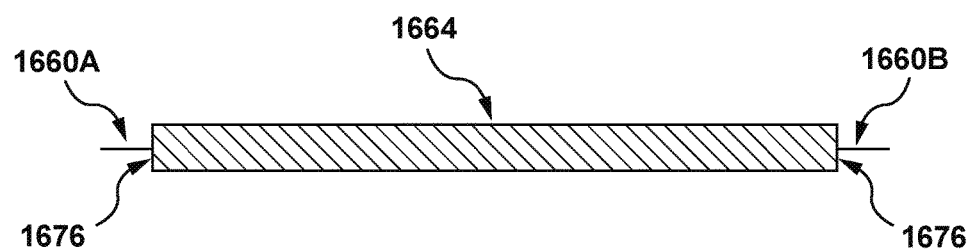
FIG. 16A depicts a sectional side view of a cover that includes a first spring component and a second spring component, wherein the cover forms a portion of a casing of a pre-load device according to an embodiment hereof.
Figure 16B:
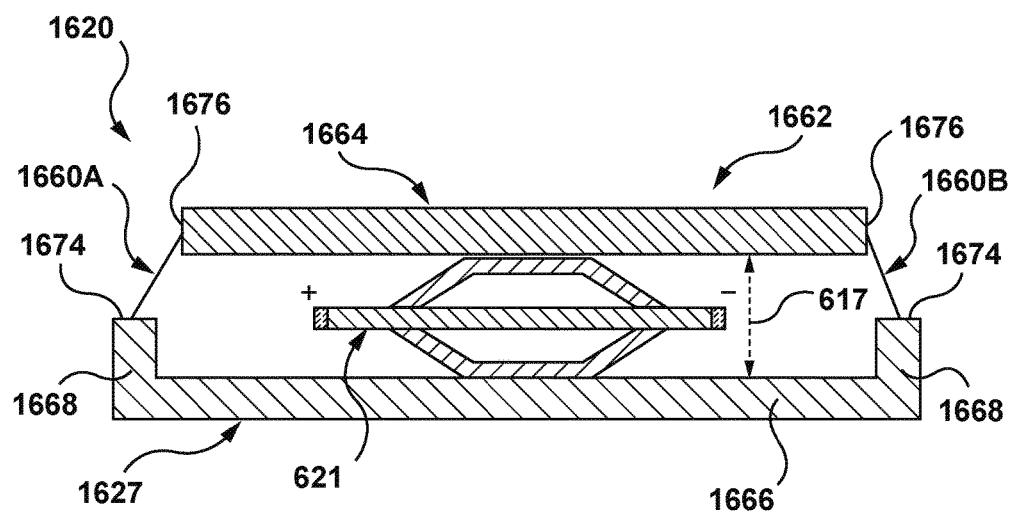
FIG. 16B depicts a sectional side view of a haptic actuator assembly with a haptic actuator and a pre-load device, wherein the pre-load device includes a casing that includes the cover of FIG. 16A and a base, according to an embodiment hereof.

FIGS. 16A and 16B illustrates an embodiment in which the pre-load, or more specifically a compressive load, is created by a casing 1662 that includes a first spring component 1660A and a second spring component 1660B that releasably couple elements of the casing 1662 together. More specifically, FIG. 16B illustrates a sectional side view of a haptic actuator assembly 1620 that includes the haptic actuator 621 previously described above as well as a pre-load device 1627. Although the haptic actuator assembly 1620 is shown and described with the haptic actuator 621, any haptic actuator described herein may also be utilized with the pre-load device 1627. The pre-load device 1627 is configured to create a compressive load on the haptic actuator 621 along the axis 617, and the compressive load opposes expansion, or more generally deformation, of the haptic actuator 621 along the axis 617.

The pre-load device 1627 includes the first spring component 1660A, the second spring component 1660B and the casing 1662. The casing 1662 includes a cover 1664 and a base 1666 spaced apart from and extending parallel to the cover 1664. In an embodiment, the base 1666 includes a sidewall 1668 that is disposed around a perimeter of the base 1666 and extends in a direction towards the cover 1664. The sidewall 1668 does not extend between the base 1666 and the cover 1664, and does not directly contact the cover 1664. The sidewall 1668 defines an end surface 1674. The first spring component 1660A and the second spring component 1660B are each attached to and extend outwardly from a respective outer end 1676 of the cover 1664, as best shown in FIG. 16A which is a side view of the cover 1664 prior to assembly into the casing 1662. The first spring component 1660A and the second spring component 1660B are disposed at opposing ends of the casing 1662. When the cover 1664 is assembled onto the base 1666, as shown in FIG. 16B, the first spring component 1660A and the second spring component 1660B are each releasably attached to the base 1666. More particularly, the first spring component 1660A extends between the outer end 1676 of the cover 1664 and the end surface 1674 of the sidewall 1668, and the second spring component 1660B extends between the outer end 1676 of the cover 1664 and the end surface 1674 of the sidewall 1668.

After the cover 1664 and the base 1666 are assembled such that they are coupled together via the first spring component 1660A and the second spring component 1660B, the casing 1662 is configured to hold or contain the haptic actuator 621, including both the layer 621a of piezoelectric material and the displacement conversion device 621b-1/621b-2. The haptic actuator 621 is disposed between the cover 1664 and the base 1666, with the cover 1664 and the base 1666 being disposed at respective opposite ends of the haptic actuator 621 along the axis 617 thereof. In an embodiment, the base 1666 supports the haptic actuator 621, or stated another way the haptic actuator 621 is disposed on an interior surface of the base 1166. In an embodiment, the base 1666 may be attached to the haptic actuator 621 via an adhesive or some other manner of attachment.

As described above with respect to casing 1162, the casing 1662 functions to provide the haptic actuator assembly 1620 as a self-contained device in which the pre-load generated thereby is a load that is, e.g., built into the haptic actuator assembly 1620 or internal to the haptic actuator assembly 1620. As such, the pre-load generated by the pre-load device 1627 may be a load that is independent of user interaction or influences that are external to the haptic actuator assembly 1620. For example, the haptic actuator assembly 1620 having the pre-load device 1627 may be disposed at a location at which the haptic actuator assembly 1620 will experience little to no external load. For instance, the haptic actuator assembly 1620 may be disposed at a back side of a mobile phone, such as on an inner surface of a back panel of the mobile phone as described above with respect to FIG. 3B. The back panel may have a low mass, and may exert less than 1 N of external load on the haptic actuator assembly 1120. The sidewalls 1668 of the base 1666 assist in the above-described functions of the casing 1662. However, in an embodiment, one or more of the sidewalls 1668 may be omitted. Further, the first spring component 1660A and/or the second spring component 1660B may extend between the cover 1664 and the base 1666 if the spring component is disposed at a location in which a sidewall has been omitted. In addition, the sidewalls 1668 are not required to extend the entire length or width of the cover 1664 and/or the base 1666. For example, in an embodiment, each sidewall 1668 may have a column configuration and be disposed, e.g., between the corners of the cover 1664 and the base 1666.

Collectively, the first spring component 1660A and the second spring component 1660B are configured to create a compressive load on the haptic actuator 621 along the axis 617, and the compressive load opposes expansion of the haptic actuator 621 along the axis 617. The first spring component 1660A and the second spring component 1660B may be any type of spring element having the spring properties to exert the desired compressive force, including but not limited to elastomers, helical or coiled springs, leaf springs, flat springs, wave washers, snap dome springs, or a compliant element such as rubber, foam, or flexures. Further, although there is a single spring element illustrated in FIG. 16 for each of the first spring component 1660A and the second spring component 1660B, it should be understood that in some implementations, multiple spring components may be used for each of the first spring component 1660A and the second spring component 1660B to exert the desired compressive force.

To generate a pre-load, the first spring component 1660A and the second spring component 1660B each provide a pulling spring force to urge the cover 1664 and the base 1666 against the haptic actuator 621. Stated another way, the first spring component 1660A and the second spring component 1660B may each be considered to be a tensioner that applies a force to urge the cover 1664 and the base 1666 towards each other. In turn, the cover 1664 and the base 1666 thereby exert the desired compressive force against the haptic actuator 621 to generate the pre-load. In an embodiment, first spring component 1660A and the second spring component 1660B may be configured to collectively generate a pre-load that is in a range of 2 N to 4 N. The pre-load in a range of 2 N to 4 N enables the haptic actuator 621 to reliably and predictably deform in response to an applied electrical potential. When the haptic actuator 621 deforms in response to an applied electrical potential, the pre-load exerted on the haptic actuator 621 constrains the displacement from the haptic actuator 621 to a value that is a fraction (e.g., ½, ¾) of its rated displacement. By decreasing the displacement output from the haptic actuator 621, the first spring component 1660A and the second spring component 1660B are configured to collectively cause an increase in the force output by the haptic actuator 621. As a result, when a vibrotactile haptic effect is generated by the haptic actuator assembly 1620, the force accompanying the vibrotactile haptic effect may be stronger and more perceivable relative to the situation in which the vibrotactile haptic effect is generated by a haptic actuator having no pre-load.

Similar to the haptic actuator assembly 1120, the haptic actuator assembly 1620 can function as a harmonic oscillator that runs at a relatively high frequency and operates similar to the haptic actuator assembly 1120. In operation, when a power source (not shown in FIG. 16) provides a sinusoidal drive signal to the haptic actuator assembly 1620, the haptic actuator 621 vibrates as directed by the oscillating drive signal. More particularly, as described above with respect to the operation of the haptic actuator 621, the displacement that is output by the haptic actuator 621 along the axis 617 may come from the expansion or contraction of the haptic actuator 621. In an embodiment, displacement of the haptic actuator 621 along the axis 617 causes movement or vibration of both the cover 1664 and the base 1666. In another embodiment, one of the cover 1664 or the base 1666 is configured to act as a mechanical ground as described in more detail below such that displacement of the haptic actuator 621 along the axis 617 causes movement or vibration of only the other opposing structure that is not configured to be a mechanical ground. The haptic actuator assembly 1620 thus vibrates and provides haptic sensations to the housing or part of the haptic-enabled device to which it is attached.

As stated above, in an embodiment hereof, one of the cover 1664 or the base 1666 may be configured to act as a mechanical ground while the other structure vibrates/displaces. For example, one of the cover 1664 or the base 1666 may be of a relatively stiffer material having a suitable Young's modulus and/or thickness to be configured to act as a mechanical ground. The mechanical ground (i.e., one of the cover 1664 or the base 1666) translates the force generated by the haptic actuator 621 to the other planar element (i.e., the other of the cover 1664 or the base 1666). Stated another way, the mechanical ground functions to essentially channel displacement from the haptic actuator assembly 1620 toward the other planar element. As a result, most or all of the expansion of the haptic actuator 621 may be channeled toward vibrating or displacing the other planar element.

In an embodiment, the components of the haptic actuator assembly 1620 can be chosen to provide more effective haptic sensations. More particularly, the spring constants of first spring component 1660A and the second spring component 1660B may be selected to tune the respective spring component and tailor the haptic effects accordingly. For example, in an embodiment, the haptic actuator assembly 1620 may be configured to realize mechanical resonance. Stated another way, the resonant frequency of the haptic actuator assembly 1620 is tailored via the first spring component 1660A and the second spring component 1660B. The haptic actuator 621 has a first resonant frequency and the haptic actuator assembly 1620 has a second resonant frequency, the second resonant frequency being different than the first resonant frequency. The second resonant frequency is a function of or is determined via the spring constants of the first spring component 1660A and the second spring component 1660B. Due to the addition of the first spring component 1660A and the second spring component 1660B, the total spring constant of the haptic actuator assembly 1620 is different than the spring constant of the haptic actuator 621 alone. As such, the resonant frequency of the haptic actuator assembly 1620 varies depending on the spring constants of each of the first spring component 1660A and the second spring component 1660B and the resonant frequency of the haptic actuator assembly 1620 may be controlled by selecting particular or predetermined spring components 1660A, 1660B. Stated another way, the first spring component 1660A and the second spring component 1660B may be chosen to change or alter the resonant frequency of the haptic actuator 621 alone such that the haptic actuator assembly 1620 has a desired or predetermined resonant frequency in order to amplify the output force and effects. By controlling the resonant frequency, the haptic actuator assembly 1620 may be configured to resonate at a certain frequency to present a wide spectrum of frequencies by amplitude modulation techniques.

In addition to tuning or tailoring the resonant frequency of the haptic actuator assembly 1620 via the first spring component 1660A and the second spring component 1660B, additional mass may be included on the moving planar element (i.e., one of the cover 1664 or the base 1664, which is not configured to be the mechanical ground) to ensure that the moving planar element has sufficient acceleration in the resonant frequency. Additional mass may be included on the moving planar element by attaching a separate component of a predetermined mass, or by forming the moving planar element to have the predetermined mass.

In an embodiment, the spring constants of the first spring component 1660A and the second spring component 1660B may be different from each other. More particularly, when the first spring component 1660A and the second spring component 1660B have different spring constants and the haptic actuator 621 expands or otherwise generates displacement along the axis 617, the displacement of the base 1666 and/or the cover 1664 is off-center relative to its center of mass, and thus may generate a torque (also referred to as a moment) about the center of mass of the base 1666 and/or the cover 1664. The base 1666 and/or the cover 1664 may thus exhibit some rotation about its center of mass when being pushed by the haptic actuator 621. Stated differently, when the first spring component 1660A and the second spring component 1660B have different spring constants, part of the base 1666 and/or the cover 1664 may act as a lever when being pushed by the haptic actuator 621. This lever configuration may be able to enhance a haptic effect generated by the movement of the haptic actuator 621 and of the base 1666 and/or the cover 1664.

Figure 17:
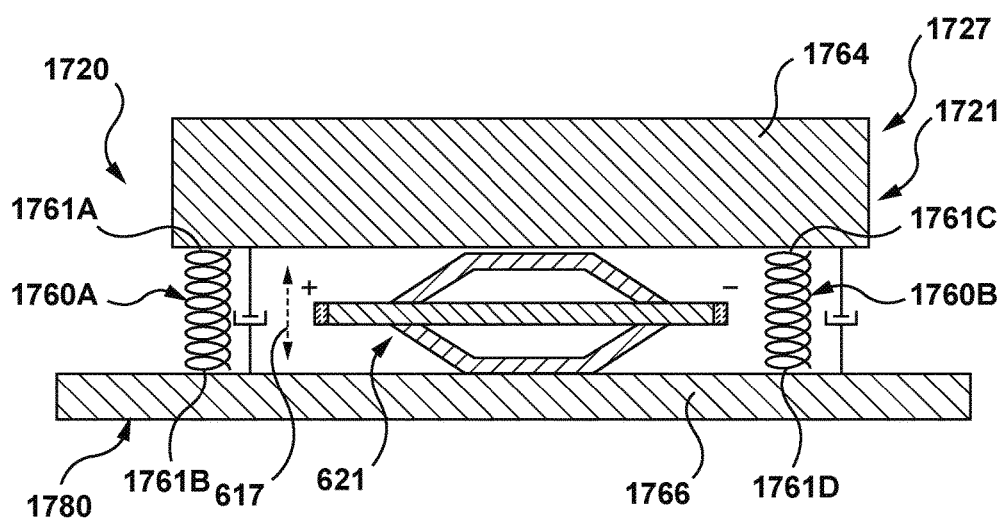
FIG. 17 depicts a sectional side view of a haptic actuator assembly with a haptic actuator and a pre-load device, wherein the pre-load device includes a casing, a first spring component and a second spring component, according to an embodiment hereof.

FIG. 17 illustrates an embodiment in which the pre-load, or more specifically a compressive load, is created by integrating the haptic actuator 621 into preexisting components of a haptic-enabled device and further including a first spring component 1760A and a second spring component 1760B to tune the resonant frequency of the assembly. More specifically, FIG. 17 illustrates a sectional side view of a haptic actuator assembly 1720 that includes the haptic actuator 621 previously described above as well as a pre-load device 1727. Although the haptic actuator assembly 1720 is shown and described with the haptic actuator 621, any haptic actuator described herein may also be utilized with the pre-load device 1727. The pre-load device 1727 is configured to create a compressive load on the haptic actuator 621 along the axis 617, and the compressive load opposes expansion, or more generally deformation, of the haptic actuator 621 along the axis 617.

In the embodiment of FIG. 17, the pre-load device 1727 includes components of a battery 1780 of a haptic-enabled device. However, although the pre-load device 1727 is described with battery parts or components, this is merely an example of how to implement the haptic actuator assembly 1720 inside preexisting components of a haptic-enabled device, and other preexisting components of the haptic-enabled device may similarly be utilized. The battery 1780 includes a cover 1764 and a base 1766 spaced apart from and extending parallel to the cover 1764. In an embodiment, the cover 1764 and/or the base 1766 of the battery 1780 may be a printed circuit board. The battery 1780 is configured to house or contain the haptic actuator 621, including both the layer 621a of piezoelectric material and the displacement conversion device 621b-1/621b-2. The haptic actuator 621 is disposed between the cover 1764 and the base 1766, with the cover 1764 and the base 1766 being disposed at respective opposite ends of the haptic actuator 621 along the axis 617 thereof. In an embodiment, the base 1766 supports the haptic actuator 621, or stated another way the haptic actuator 621 is disposed on an interior surface of the base 1766. In an embodiment, the base 1766 may be attached to the haptic actuator 621 via an adhesive or some other manner of attachment.

The first spring component 1760A is disposed such that a first end 1761A is coupled to an interior surface of the cover 1764 and a second opposing end 1761B is coupled to an interior surface of the base 1766. Similarly, the second spring component 1760B is disposed such that a first end 1761C is coupled to the interior surface of the cover 1764 and a second opposing end 1761D is coupled to the interior surface of the base 1766. The first spring component 1760A and the second spring component 1760B are shown as helical elements for illustrative purposes only to represent the functional operation thereof and this depiction is not intended to describe, or limit, an actual physical shape thereof. The first spring component 1760A and the second spring component 1760B may be any type of spring element having the spring properties to tune the resonant frequency of the haptic actuator assembly 1720 as described in more detail below, including but not limited to elastomers, helical or coiled springs, leaf springs, flat springs, wave washers, snap dome springs, or a compliant element such as rubber, foam, or flexures.

In the embodiment of FIG. 17, the base 1766 is configured to act as a mechanical ground while the cover 1764 provides the mass required to pre-load the haptic actuator 621. Stated another way, in this embodiment, the mass of the cover 1764 is configured to create a compressive load on the haptic actuator 621 along the axis 617, and the compressive load opposes expansion of the haptic actuator 621 along the axis 617. The haptic actuator assembly 1720 can function as a harmonic oscillator that runs at a relatively high frequency. In operation, when a power source (not shown in FIG. 17) provides a sinusoidal drive signal to the haptic actuator assembly 1720, the haptic actuator 621 vibrates as directed by the oscillating drive signal. More particularly, as described above with respect to the operation of the haptic actuator 621, the displacement that is output by the haptic actuator 621 along the axis 617 may come from the expansion or contraction of the haptic actuator 621. The haptic actuator assembly 1720 thus vibrates and provides haptic sensations to the battery 1780 to which it is attached.

The haptic actuator assembly 1720 is configured to realize mechanical resonance via the first spring component 1760A and the second spring component 1760B. More particularly, the haptic actuator 621 has a first resonant frequency and the haptic actuator assembly 1720 has a second resonant frequency, the second resonant frequency being different than the first resonant frequency. The second resonant frequency is a function of or is determined via the spring constants of the first spring component 1760A and the second spring component 1760B. Due to the addition of the first spring component 1760A and the second spring component 1760B, the total spring constant of the haptic actuator assembly 1720 is different than the spring constant of the haptic actuator 621 alone. As such, the resonant frequency of the haptic actuator assembly 1720 varies depending on the spring constants of each of the first spring component 1760A and the second spring component 1760B and the resonant frequency of the haptic actuator assembly 1720 may be controlled by selecting particular or predetermined spring components 1760A, 1760B. Stated another way, the first spring component 1760A and the second spring component 1760B may be chosen to change or alter the resonant frequency of the haptic actuator 621 alone such that the haptic actuator assembly 1720 has a desired or predetermined resonant frequency in order to amplify the output force and effects. By controlling the resonant frequency, the haptic actuator assembly 1720 may be configured to resonate at a certain frequency to present a wide spectrum of frequencies by amplitude modulation techniques.

In an embodiment, an overall thickness of the haptic actuator assembly 1720/1620/1520/1420/1320/1120 may be in a range of 2 mm to 10 mm.

In an embodiment, when a voltage difference of, e.g., 50 V to 100 V is applied to two electrodes of a haptic actuator 621, and when the compressive load or other pre-load is applied to the haptic actuator 621 by the pre-load device 1727/1627/1527/1427/1327/1127, the haptic actuator 621 outputs a displacement (relative to a baseline state in which no voltage difference is being applied to the haptic actuator 621) that is in a range of 5 µm to 15 µm, and the haptic actuator assembly 1720/1620/1520/1420/1320/1120 is configured to output a force along the axis 617 that is in a range of 2N to 10 N.

In an embodiment, when the voltage difference being applied to the haptic actuator 621 is, e.g., between 50 V and 100 V, and when the compressive load is applied to the haptic actuator 621 by the pre-load device 1727/1627/1527/1427/1327/1127, the haptic actuator outputs a displacement (relative to the baseline state) that is in a range of 25% to 50% of a defined nominal displacement for the haptic actuator 621, wherein the nominal displacement may be specific to the voltage difference. Further in this example, the haptic actuator assembly 1720/1620/1520/1420/1320/1120 may be configured to output a force along the axis 617 that is in a range of 50% to 75% of a defined blocking force for the haptic actuator 621, wherein the blocking force may also be specific to the voltage difference.

In an embodiment, the control unit 130/1130 may be configured to generate a drive signal for the haptic actuator 621 that is at a resonant frequency of the respective haptic actuator assembly 1720/1620/1520/1420/1320/1120. In an embodiment, the drive signal may have an amplitude (e.g., peak-to-peak amplitude) that is below a defined threshold, in order to further avoid generating excessive force or displacement that would damage the haptic actuator, even with the presence of a pre-load.

In an embodiment, the control unit 130/1130 may be configured to generate a drive signal with a frequency content that includes at least a first frequency that is a resonant frequency of the haptic actuator assembly 1720/1620/1520/1420/1320/1120 and a second frequency that is not the resonant frequency of the haptic actuator assembly 1720/1620/1520/1420/1320/1120. In other words, the drive signal may include a first component having the first frequency and a second component having the second frequency. In some cases, the first component and the second component may be the only frequencies of the drive signal. The control unit 130/1130 may cause the first component of the drive signal to have a first amplitude that is below the defined threshold (because the first component has the resonant frequency), and may cause the second component to have a second amplitude that is higher than the first amplitude and above the defined threshold.

Additional discussion of various embodiments is presented below:

Embodiment 1 is a haptic actuator assembly, comprising: a haptic actuator and a pre-load device. The haptic actuator includes a layer of piezoelectric material configured to generate strain along a parallel axis, the parallel axis being parallel to a planar surface of the layer, and includes a displacement conversion device configured to convert the strain of the layer of piezoelectric material along the parallel axis to expansion or contraction of the haptic actuator along a perpendicular axis, the perpendicular axis being perpendicular to the planar surface of the layer. The expansion or contraction of the haptic actuator is configured to generate a displacement of the haptic actuator along the perpendicular axis.

The pre-load device is adjacent to the haptic actuator and configured to generate a compressive load on the haptic actuator along the perpendicular axis. The pre-load device includes a casing having a cover and a base spaced apart from and extending parallel to the cover. The haptic actuator is disposed between the cover and the base, the cover and the base being disposed at respective opposite ends of the haptic actuator along the perpendicular axis thereof. A first spring component is disposed within the casing such that a first end of the first spring component is coupled to an interior surface of the cover and a second opposing end of the first component is coupled to an outer surface of the haptic actuator. The first spring component is configured to exert a force in order to create the compressive load on the haptic actuator along the perpendicular axis.

Embodiment 2 includes the haptic actuator assembly of embodiment 1, wherein the displacement conversion device of the haptic actuator is a displacement amplification device configured to convert a displacement output by the layer of piezoelectric material along the parallel axis due to the strain thereof to a greater displacement of the haptic actuator along the perpendicular axis.

Embodiment 3 includes the haptic actuator assembly of embodiment 2, wherein the displacement amplification device of the haptic actuator includes a lever device configured to convert the displacement along the parallel axis to the greater displacement along the perpendicular axis.

Embodiment 4 includes the haptic actuator assembly of embodiment 3, wherein the lever device of the haptic actuator includes a first disc and a second disc disposed on respective opposite planar surfaces of the layer of piezoelectric material, wherein each disc of the first disc and the second disc forms a truncated cone with a respective planar surface of the layer of piezoelectric material.

Embodiment 5 includes the haptic actuator assembly of any one of embodiments 1-4, wherein the first spring component is a spring plunger.

Embodiment 6 includes the haptic actuator assembly of any one of embodiments 1-4, wherein the first spring component includes a screw and a flexible film component, the screw being configured to adjust a spring force of the flexible film component.

Embodiment 7 includes the haptic actuator assembly of any one of embodiments 1-6, wherein the pre-load device further includes a second spring component disposed within the casing such that a first end of the second spring component is coupled to an interior surface of the base and a second opposing end of the second spring component is coupled to an outer surface of the haptic actuator. The first spring component and the second spring component are configured to collectively exert the force in order to create the compressive load on the haptic actuator along the perpendicular axis.

Embodiment 8 includes the haptic actuator assembly of embodiment 7, wherein the first spring component has a first spring constant and the second spring component has a second spring constant, the first spring constant being different than the second spring constant.

Embodiment 9 includes the haptic actuator assembly of any one of embodiments 1-8, wherein the compressive load along the perpendicular axis generated by the first component and the second component of the pre-load device is in a range of 2 N to 4 N.

Embodiment 10 includes the haptic actuator assembly of any one of embodiments 1-9, wherein the haptic actuator further comprises at least two electrodes attached to or embedded within the layer of piezoelectric material and configured to create a voltage difference along the perpendicular axis. The layer of piezoelectric material is configured to contract along the parallel axis in response to the voltage difference along the perpendicular axis.

Embodiment 11 includes the haptic actuator assembly of embodiment 10, wherein when the voltage difference between the at least two electrodes is between 50 V and 100 V and when the compressive load is applied to the haptic actuator by the pre-load device, the haptic actuator outputs a displacement along the perpendicular axis, relative to a baseline state in which there is no voltage difference between the at least two electrodes, that is in a range of 1 μm to 15 μm, and the haptic actuator assembly is configured to output a force along the perpendicular axis that is in a range of 2N to 10 N.

Embodiment 12 includes the haptic actuator assembly of any one of embodiments 1-11, wherein the haptic actuator has a first resonant frequency and the haptic actuator assembly has a second resonant frequency, the second resonant frequency being different than the first resonant frequency and the second resonant frequency being determined via a spring constant of the first spring component.

Embodiment 13 is a haptic actuator assembly, comprising: a haptic actuator and a pre-load device. The haptic actuator includes a layer of piezoelectric material configured to generate strain along a parallel axis, the parallel axis being parallel to a planar surface of the layer, and includes a displacement conversion device configured to convert the strain of the layer of piezoelectric material along the parallel axis to expansion or contraction of the haptic actuator along a perpendicular axis, the perpendicular axis being perpendicular to the planar surface of the layer. The expansion or contraction of the haptic actuator is configured to generate a displacement of the haptic actuator along the perpendicular axis.

The pre-load device is adjacent to the haptic actuator and configured to generate a compressive load on the haptic actuator along the perpendicular axis. The pre-load device includes a casing having a cover, a base spaced apart from and extending parallel to the cover, a first spring component, and a second spring component. The first spring component and the second spring component are disposed at respective opposite ends of the cover and each of the first spring component and the second spring component extends between the cover and the base. The first spring component and the second spring component are configured to collectively exert a force in order to create the compressive load on the haptic actuator along the perpendicular axis. The haptic actuator is disposed between the cover and the base, the cover and the base being disposed at respective opposite ends of the haptic actuator along the perpendicular axis thereof.

Embodiment 14 includes the haptic actuator assembly of embodiment 13, wherein the first spring component and the second spring component are attached to the cover and are releasably attached to the base.

Embodiment 15 is a haptic-enabled device comprising: a housing, a power source, and a haptic actuator assembly configured to generate a haptic effect at an outer surface of the housing. The haptic actuator includes a layer of piezoelectric material configured to generate strain along a parallel axis, the parallel axis being parallel to a planar surface of the layer, and includes at least two electrodes attached to or embedded within the layer of piezoelectric material, and includes a displacement conversion device configured to convert the strain of the layer of piezoelectric material along the parallel axis to expansion or contraction of the haptic actuator along a perpendicular axis, the perpendicular axis being perpendicular to the planar surface of the layer. The expansion or contraction of the haptic actuator is configured to generate a displacement of the haptic actuator along the perpendicular axis.

The pre-load device is adjacent to the haptic actuator and configured to generate a compressive load on the haptic actuator along the perpendicular axis. The pre-load device includes a casing having a cover and a base spaced apart from and extending parallel to the cover. The haptic actuator is disposed between the cover and the base, the cover and the base being disposed at respective opposite ends of the haptic actuator along the perpendicular axis thereof. A first spring component is disposed within the casing such that a first end of the first spring component is coupled to an interior surface of the cover and a second opposing end of the first component is coupled to an outer surface of the haptic actuator. The first spring component is configured to exert a force in order to create the compressive load on the haptic actuator along the perpendicular axis.

The haptic-enabled device further comprises a control unit configured to control the power source to provide power to the at least two electrodes of the haptic actuator.

Embodiment 16 includes the haptic-enabled device of embodiment 15, wherein any compressive load applied to the haptic actuator assembly by the housing of the haptic-enabled device is less than 1 N.

Embodiment 17 includes the haptic-enabled device of any one of embodiments 15-16, further comprising a touch screen device that forms a first side of the housing. The housing comprises a back panel that forms a second and opposite side of the housing. The haptic actuator assembly is disposed at the second side of the housing, so that force generated by the haptic actuator assembly is exerted against the second side of the housing.

Embodiment 18 includes the haptic-enabled device of any one of embodiments 15-17, wherein the control unit is configured to control the power source to provide a drive signal to the haptic actuator and wherein the drive signal is a periodic signal having a frequency equal to a resonant frequency of the haptic actuator assembly.

Embodiment 19 includes the haptic-enabled device of any one of embodiments 15-18, wherein the haptic actuator has a first resonant frequency and the haptic actuator assembly has a second resonant frequency, the second resonant frequency being different than the first resonant frequency and the second resonant frequency being determined via a spring constant of the first spring component.

Embodiment 20 includes the haptic-enabled device of any one of embodiments 15-19, wherein the pre-load device further includes a second spring component disposed within the casing such that a first end of the second spring component is coupled to an interior surface of the base and a second opposing end of the second spring component is coupled to an outer surface of the haptic actuator, the first spring component and the second spring component being configured to collectively exert the force in order to create the compressive load on the haptic actuator along the perpendicular axis.

While various embodiments have been described above, it should be understood that they have been presented only as illustrations and examples of the present invention, and not by way of limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the appended claims and their equivalents. It will also be understood that each feature of each embodiment discussed herein, and of each reference cited herein, can be used in combination with the features of any other embodiment. All patents and publications discussed herein are incorporated by reference herein in their entirety.

What is claimed is:

1. A haptic actuator assembly, comprising:
   a haptic actuator including
   a layer of piezoelectric material configured to generate strain along a parallel axis, the parallel axis being parallel to a planar surface of the layer, and
   a displacement conversion device configured to convert the strain of the layer of piezoelectric material along the parallel axis to expansion or contraction of the haptic actuator along a perpendicular axis, the perpendicular axis being perpendicular to the planar surface of the layer,
   wherein the expansion or contraction of the haptic actuator is configured to generate a displacement of the haptic actuator along the perpendicular axis; and
   a pre-load device adjacent to the haptic actuator and configured to generate a compressive load on the haptic actuator along the perpendicular axis, the pre-load device including
   a casing having a cover and a base spaced apart from and extending parallel to the cover, wherein the haptic actuator is disposed between the cover and the base, the cover and the base being disposed at respective opposite ends of the haptic actuator along the perpendicular axis thereof, and
   a first spring component disposed within the casing such that a first end of the first spring component is coupled to an interior surface of the cover and a second opposing end of the first component is coupled to an outer surface of the haptic actuator, the first spring component being configured to exert a force in order to create the compressive load on the haptic actuator along the perpendicular axis.

2. The haptic actuator assembly of claim 1, wherein the displacement conversion device of the haptic actuator is a displacement amplification device configured to convert a displacement output by the layer of piezoelectric material along the parallel axis due to the strain thereof to a greater displacement of the haptic actuator along the perpendicular axis.

3. The haptic actuator assembly of claim 2, wherein the displacement amplification device of the haptic actuator includes a lever device configured to convert the displacement along the parallel axis to the greater displacement along the perpendicular axis.

4. The haptic actuator assembly of claim 3, wherein the lever device of the haptic actuator includes a first disc and a second disc disposed on respective opposite planar surfaces of the layer of piezoelectric material, wherein each disc of the first disc and the second disc forms a truncated cone with a respective planar surface of the layer of piezoelectric material.

5. The haptic actuator assembly of claim 1, wherein the first spring component is a spring plunger.

6. The haptic actuator assembly of claim 1, wherein the first spring component includes a screw and a flexible film component, the screw being configured to adjust a spring force of the flexible film component.

7. The haptic actuator assembly of claim 1, wherein the pre-load device further includes
   a second spring component disposed within the casing such that a first end of the second spring component is coupled to an interior surface of the base and a second opposing end of the second spring component is coupled to an outer surface of the haptic actuator, the first spring component and the second spring component being configured to collectively exert the force in order to create the compressive load on the haptic actuator along the perpendicular axis.

8. The haptic actuator assembly of claim 7, wherein the first spring component has a first spring constant and the second spring component has a second spring constant, the first spring constant being different than the second spring constant.

9. The haptic actuator assembly of claim 1, wherein the compressive load along the perpendicular axis generated by the first component and the second component of the pre-load device is in a range of 2 N to 4 N.

10. The haptic actuator assembly of claim 1, wherein the haptic actuator further comprises at least two electrodes attached to or embedded within the layer of piezoelectric material and configured to create a voltage difference along the perpendicular axis, wherein the layer of piezoelectric material is configured to contract along the parallel axis in response to the voltage difference along the perpendicular axis.

11. The haptic actuator assembly of claim 10, wherein when the voltage difference between the at least two electrodes is between 50 V and 100 V and when the compressive load is applied to the haptic actuator by the pre-load device, the haptic actuator outputs a displacement along the perpendicular axis, relative to a baseline state in which there is no voltage difference between the at least two electrodes, that is in a range of 1 μm to 15 μm, and the haptic actuator assembly is configured to output a force along the perpendicular axis that is in a range of 2 N to 10 N.

12. The haptic actuator assembly of claim 1, wherein the haptic actuator has a first resonant frequency and the haptic actuator assembly has a second resonant frequency, the second resonant frequency being different than the first resonant frequency and the second resonant frequency being determined via a spring constant of the first spring component.

13. A haptic actuator assembly, comprising:
a haptic actuator including
- a layer of piezoelectric material configured to generate strain along a parallel axis, the parallel axis being parallel to a planar surface of the layer, and
- a displacement conversion device configured to convert the strain of the layer of piezoelectric material along the parallel axis to expansion or contraction of the haptic actuator along a perpendicular axis, the perpendicular axis being perpendicular to the planar surface of the layer,
- wherein the expansion or contraction of the haptic actuator is configured to generate a displacement of the haptic actuator along the perpendicular axis; and a pre-load device adjacent to the haptic actuator and configured to generate a compressive load on the haptic actuator along the perpendicular axis, the pre-load device including
- a casing having a cover, a base spaced apart from and extending parallel to the cover, a first spring component, and a second spring component, wherein the first spring component and the second spring component are disposed at respective opposite ends of the cover and each of the first spring component and the second spring component extends between the cover and the base, and
- wherein the first spring component and the second spring component are configured to collectively exert a force in order to create the compressive load on the haptic actuator along the perpendicular axis, and
- wherein the haptic actuator is disposed between the cover and the base, the cover and the base being disposed at respective opposite ends of the haptic actuator along the perpendicular axis thereof.

14. The haptic actuator assembly of claim 13, wherein the first spring component and the second spring component are attached to the cover and are releasably attached to the base.

15. A haptic-enabled device, comprising:
a housing;
a power source;
a haptic actuator assembly configured to generate a haptic effect at an outer surface of the housing, the haptic actuator assembly comprising
a haptic actuator including
- a layer of piezoelectric material configured to generate strain along a parallel axis, the parallel axis being parallel to a planar surface of the layer,
- at least two electrodes attached to or embedded within the layer of piezoelectric material, and
- a displacement conversion device configured to convert the strain of the layer of piezoelectric material along the parallel axis to expansion or contraction of the haptic actuator along a perpendicular axis, the perpendicular axis being perpendicular to the planar surface of the layer, wherein the expansion or contraction of the haptic actuator is configured to generate a displacement of the haptic actuator along the perpendicular axis;

a pre-load device adjacent to the haptic actuator and configured to generate a compressive load on the haptic actuator along the perpendicular axis, the pre-load device including
- a casing having a cover and a base spaced apart from and extending parallel to the cover, wherein the haptic actuator is disposed between the cover and the base, the cover and the base being disposed at respective opposite ends of the haptic actuator along the perpendicular axis thereof, and
- a first spring component disposed within the casing such that a first end of the first spring component is coupled to an interior surface of the cover and a second opposing end of the first component is coupled to an outer surface of the haptic actuator, the first spring component being configured to exert a force in order to create the compressive load on the haptic actuator along the perpendicular axis; and a control unit configured to control the power source to provide power to the at least two electrodes of the haptic actuator.

16. The haptic-enabled device of claim 15, wherein any compressive load applied to the haptic actuator assembly by the housing of the haptic-enabled device is less than 1 N.

17. The haptic-enabled device of claim 15, further comprising a touch screen device that forms a first side of the housing, wherein the housing comprises a back panel that forms a second and opposite side of the housing, wherein the haptic actuator assembly is disposed at the second side of the housing, so that force generated by the haptic actuator assembly is exerted against the second side of the housing.

18. The haptic-enabled device of claim 17, wherein the control unit is configured to control the power source to provide a drive signal to the haptic actuator and wherein the drive signal is a periodic signal having a frequency equal to a resonant frequency of the haptic actuator assembly.

19. The haptic-enabled device of claim 18, wherein the haptic actuator has a first resonant frequency and the haptic actuator assembly has a second resonant frequency, the second resonant frequency being different than the first resonant frequency and the second resonant frequency being determined via a spring constant of the first spring component.

20. The haptic-enabled device of claim 15, wherein the pre-load device further includes
a second spring component disposed within the casing such that a first end of the second spring component is coupled to an interior surface of the base and a second opposing end of the second spring component is coupled to an outer surface of the haptic actuator, the first spring component and the second spring component being configured to collectively exert the force in order to create the compressive load on the haptic actuator along the perpendicular axis.

* * * * *